US012813022B2

(12) United States Patent
Do

(10) Patent No.: US 12,813,022 B2
(45) Date of Patent: Nov. 24, 2026

(54) ULTRA-THIN FIN LIGHT-EMITTING DIODE ELECTRODE ASSEMBLY, METHOD OF MANUFACTURING THE SAME, AND LIGHT SOURCE INCLUDING THE SAME

(71) Applicant: Kookmin University Industry Academy Cooperation Foundation, Seoul (KR)

(72) Inventor: Young Rag Do, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 346 days.

(21) Appl. No.: 18/397,315

(22) Filed: Dec. 27, 2023

(65) Prior Publication Data

US 2024/0222555 A1 Jul. 4, 2024

(30) Foreign Application Priority Data

Dec. 28, 2022 (KR) ........................ 10-2022-0187629

(51) Int. Cl.
*H10H 20/831* (2025.01)
*H10H 20/01* (2025.01)
(Continued)

(52) U.S. Cl.
CPC ........ *H10H 20/831* (2025.01); *H10H 29/142* (2025.01); *H10W 90/00* (2026.01); *H10H 20/032* (2025.01)

(58) Field of Classification Search
CPC .. H10H 20/831; H10H 29/142; H10H 20/032; H10H 20/01; H10H 20/00;
(Continued)

(56) References Cited

U.S. PATENT DOCUMENTS

2018/0287010 A1* 10/2018 Sung .................... H10H 20/813
2019/0019441 A1* 1/2019 Shin ..................... H10K 59/131
(Continued)

FOREIGN PATENT DOCUMENTS

KR 101627365 B1 * 6/2016 ............... F21K 9/64
KR 101730927 4/2017
(Continued)

OTHER PUBLICATIONS

English translation of KR-2022015784 (Year: 2022).*
English translation of KR-102397458 (Year: 2022).*
English translation of KR-101627365-B1 (Year: 2016).*

*Primary Examiner* — William B Partridge
*Assistant Examiner* — David Paul Sedorook
(74) *Attorney, Agent, or Firm* — NORTON ROSE FULBRIGHT US LLP

(57) ABSTRACT

The present invention relates to a light emitting diode (LED) electrode assembly, and more particularly, to an ultra-thin fine LED electrode assembly, a method of manufacturing the same, and a light source including the same. Accordingly, as a surface of the ultra-thin fin LED element, which is in contact with an electrode, is a surface rather than a side surface through dielectrophoresis, drivable mounting efficiency increases, and at the same time, one specific surface is in selective contact with a mounting electrode, and thus a range of selection for driving power may be expanded to include a direct current (DC) power. Therefore, an LED electrode assembly having higher brightness is achieved advantageously.

13 Claims, 13 Drawing Sheets

(51) Int. Cl.
*H10H 29/14* (2025.01)
*H10W 90/00* (2026.01)

(58) Field of Classification Search
CPC .. H10H 20/042; H10H 20/052; H10H 20/062; H10H 20/80; H10H 29/00; H10H 29/01; H10H 29/10; H10H 29/20; H10H 29/30; H10H 29/80; H10W 90/00; H10W 90/15; H10W 90/155; H10W 90/10; H10W 90/20; H10W 90/22; H10W 90/231; H10W 90/24; H10W 90/26; H10W 90/271; H10W 90/275; H10W 90/28; H10W 90/284; H10W 90/288; H10W 90/291; H10W 90/293; H10W 90/297; H10W 90/401; H10W 90/701; H10W 90/811
See application file for complete search history.

(56) References Cited

U.S. PATENT DOCUMENTS

| | | | | |
|---|---|---|---|---|
| 2020/0184939 | A1* | 6/2020 | Lee | G06F 1/1626 |
| 2020/0287103 | A1* | 9/2020 | Maegawa | H10H 20/8513 |

FOREIGN PATENT DOCUMENTS

| | | | | | |
|---|---|---|---|---|---|
| KR | 10-2332350 | | | 11/2021 | |
| KR | 102397458 | | | 5/2022 | |
| KR | 102397458 | B1 | * | 5/2022 | H01L 33/486 |
| KR | 20220157584 | | | 11/2022 | |
| KR | 20220157584 | A | * | 11/2022 | H10W 90/00 |
| WO | WO 2021221438 | | | 11/2021 | |

* cited by examiner

<Y-Y' CROSS-SECTIONAL VIEW>

ULTRA-THIN FIN LIGHT-EMITTING DIODE ELECTRODE ASSEMBLY, METHOD OF MANUFACTURING THE SAME, AND LIGHT SOURCE INCLUDING THE SAME

CROSS-REFERENCE TO RELATED APPLICATION

This application claims priority to and the benefit of Korean Patent Application No. 10-2022-0187629, filed on Dec. 28, 2022, the disclosure of which is incorporated herein by reference in its entirety.

BACKGROUND

1. Field of the Invention

The present invention relates to an ultra-thin fin light emitting diode (LED) electrode assembly, and more particularly, to an ultra-thin fin LED electrode assembly in which an ultra-thin fin LED element may be intensively disposed within a desired limited area, a method of manufacturing the same, and a light source including the same.

2. Discussion of Related Art

Micro light emitting diodes (LEDs) and nano LEDs may achieve an excellent color sense, are environmental-friendly materials, and thus are used as core materials for various light sources and displays. Further, display televisions (TVs) using red, green, and blue micro-LEDs have recently been commercialized in line with research in this material field. In particular, displays and various light sources using micro-LEDs have the advantages of high performance characteristics, a very long theoretical lifetime, and high efficiency. However, like elements, there are still many problems remaining not only in arranging micro-LEDs one by one on a miniaturized electrode but also in increasing the number of micro LEDs arranged in a limited area and allowing all the arranged micro LEDs to emit light.

In detail, Korean Patent Registration No. 2332350, which is a patent document by the inventor of the present invention, discloses an LED electrode assembly using micro-nanofin LEDs having greatly improved light emitting efficiency as compared to nanorod-type LED elements according to the related art. Further, the patent document discloses that the LED electrode assembly is implemented by being self-aligned such that both ends in a longitudinal direction, in which long sides of the element are formed, come into contact with two adjacent electrodes, to which different powers are applied, through dielectrophoresis in an electric field formed by applying power to the electrode.

However, as a result of the inventor's continuous research on this, in the method disclosed in the patent document, even when both ends of the element in a long axis direction are mounted in contact with the two electrodes, the elements are mounted in different long axis directions based on one direction, for example, an electrode direction. Thus, a problem is discovered that it is difficult to increase the number of ultra-thin fin LED elements arranged in a limited unit electrode area.

Meanwhile, when LED elements are mounted on the electrode in different directions, a mountable area occupied by the LED elements per unit area increases. Thus, the number of mountable LED elements decreases, making it difficult to implement a high-brightness LED electrode assembly. Further, when LED elements are mounted in different directions, it is difficult to design and form an upper electrode on the element in various arrangements such that the upper electrode is electrically connected to the mounted ultra-thin fin LED elements. Accordingly, it is difficult to implement an LED electrode assembly in which driving of the LED element is precisely controlled for each area.

SUMMARY OF THE INVENTION

The present invention is directed to providing an ultra-thin fin light emitting diode (LED) electrode assembly, a method of manufacturing the same, and a light source including the same, in which a decrease in efficiency due to surface defects is prevented by decreasing a thickness of a photoactive layer exposed at a surface while a light emitting area increases, an LED element that maintains high light extraction efficiency and has improved brightness by minimizing a decrease in electron-hole recombination efficiency due to non-uniformity of speeds of electrons and holes and a decrease in light emitting efficiency therefrom is used, and a brightness is more greatly improve by increasing the number of LED elements mounted per unit area by controlling a longitudinal direction of the LED elements self-aligned on a lower electrode through dielectrophoresis.

Further, the present invention is also directed to providing an ultra-thin fin LED electrode assembly, a method of manufacturing the same, and a light source including the same, in which an upper electrode line may be designed in various and detailed manners, and thus LED elements may be driven in detail in various areas within one LED electrode assembly.

Meanwhile, it should be noted that the present invention is supported by the following national research and development project.

[National Research and Development Project 1]

[Unique project number] 1415174040 [Project number] 20016290 [Ministry name] Ministry of Trade, Industry and Energy

[Project management (professional) organization name] Korea Institute of Industrial Technology Evaluation and Planning

[Research business name] Electronic component industry technology development-ultra-large micro LED modular display

[Research project name] Sub-micron level blue emission light source technology for modular display Development [Contribution rate] ½ [Project carrying out organization name] Kookmin University Industry-Academic Cooperation Foundation

[Research period] Jan. 1, 2023 to Dec. 31, 2023

[National Research and Development Project 2]

[Unique project number] 1711130702 [Project number] 2021R1A2C2009521

[Ministry name] Ministry of Science and ICT [Project management (professional) organization name] National Research Foundation of Korea

[Research business name] Mid-career researcher support business

[Research project name] Development of dot-LED material and display source/application technology

[Contribution rate] ½ [Project carrying out organization name] Kookmin University Industry-Academic Cooperation Foundation

[Research period] Mar. 1, 2023 to Feb. 29, 2024

According to an aspect of the present invention, there is provided a method of manufacturing an ultra-thin fin light emitting diode (LED) electrode assembly, the method including operation (1) of forming an alignment guide extending in a first direction with a width smaller than a width of a lower electrode on an upper surface of each of a plurality of lower electrodes extending in the first direction and spaced apart from each in a second direction, operation (2) of self-aligning a plurality of ultra-thin fin LED elements such that both ends of the ultra-thin fin LED elements in a long axis direction are in contact with upper surfaces of two adjacent lower electrodes by inputting, onto the lower electrodes, a solution including the ultra-thin fin LED elements of which an X axis is a long axis with respect to an x axis, a y axis and a z axis perpendicular to each other and in which a plurality of layers to be included therein are laminated in a z axis direction and by applying assembly power to the lower electrodes, and operation (3) of forming an upper electrode line on the plurality of self-aligned ultra-thin fin LED elements, wherein a dielectric constant ($\varepsilon_1$) of a solvent included in the solution is greater than or equal to a dielectric constant ($\varepsilon_2$) of the alignment guide.

The width of the alignment guide may be smaller than or equal to a half of the width of the lower electrode, and a thickness of the alignment guide may be smaller than or equal to a thickness that is a length of the ultra-thin fin LED element in a z axis direction.

The ultra-thin fin LED element may have an aspect ratio (a/b) of 3.0 or more between a length (b) of a short axis corresponding to a larger length among lengths in a y axis direction or the z axis direction and a length (a) of a long axis corresponding to an x axis.

The solvent may have a dielectric constant that is smaller than or equal to 30.

The assembly power applied in operation (2) may have a frequency in a range of 1 kHz to 100 MHz and a voltage in a range of 5 Vpp to 100 Vpp.

The dielectric constant ($\varepsilon_1$) of the solvent is greater than the dielectric constant ($\varepsilon_2$) of the alignment guide by 5.0 or more.

According to another aspect of the present invention, there is provided an ultra-thin fin light emitting diode (LED) electrode assembly including a plurality of lower electrodes extending long and spaced apart from each other in a first direction, an alignment guide disposed on an upper surface of each of the plurality of lower electrodes and extending in the first direction with a width smaller than that of each of the lower electrodes, a plurality of ultra-thin fin LED elements arranged such that both ends of the ultra-thin fin LED elements, of which an X axis is a long axis with respect to an x axis, a y axis and a z axis perpendicular to each other and in which a plurality of layers to be included therein are laminated in a z axis direction, in a long axis direction are in contact with upper surfaces of two adjacent lower electrodes, and an upper electrode line disposed on the plurality of ultra-thin fin LED elements, wherein, among all the arranged ultra-thin fin LED elements, a vertical mounting percentage that is a ratio of the ultra-thin fin LED elements of which a mounting angle formed between the long axis direction of the ultra-thin fin LED element and a second direction perpendicular to the first direction of the lower electrode satisfies 5° or less is 75% or more.

The vertical mounting percentage may be 82% or more.

A length of the ultra-thin fin LED element in the long axis direction may be in a range of 1 μm to 10 μm and a thickness thereof may be in a range of 0.1 μm to 3 μm.

A width of the ultra-thin fin LED element, which is a length in a y axis direction, may be smaller than a thickness thereof.

According to still another aspect of the present invention, there is provided a light source including the ultra-thin fin LED electrode assembly according to the present invention.

The light source may further include a color conversion material excited by light radiated from the ultra-thin fin LED electrode assembly.

Terms used in the present invention are defined below.

In the description of an implementation according to the present invention, when it is described that each layer, area, pattern, or substrate is formed "on," "at an upper portion of," "above," "under," "at a lower portion of," and "below" each layer, area, or pattern, the terms "on," "upper portion," "above," "under," "lower portion," and "below" include meaning of both "directly" and "indirectly".

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIGS. 1 and 2 are views of an ultra-thin fin light emitting diode (LED) electrode assembly according to an embodiment of the present invention, wherein FIG. 1 is a plan view of the ultra-thin fin LED electrode assembly, and FIG. 2 is a schematic cross-sectional view along boundary line X-X' of FIG. 1;

FIGS. 3 and 4 are views of the ultra-thin fin LED element included in an embodiment of the present invention, wherein FIG. 3 is a perspective view of the ultra-thin fin LED element, and FIG. 4 is a cross-sectional view along line X-X' of FIG. 3;

DETAILED DESCRIPTION OF EXEMPLARY EMBODIMENTS

Hereinafter, embodiments of the present invention will be described in detail with reference to the accompanying drawings so that those skilled in the art to which the present invention pertains may easily implement the present invention. The present invention may be implemented in various different forms and is not limited to the embodiments described herein.

Figure 1:
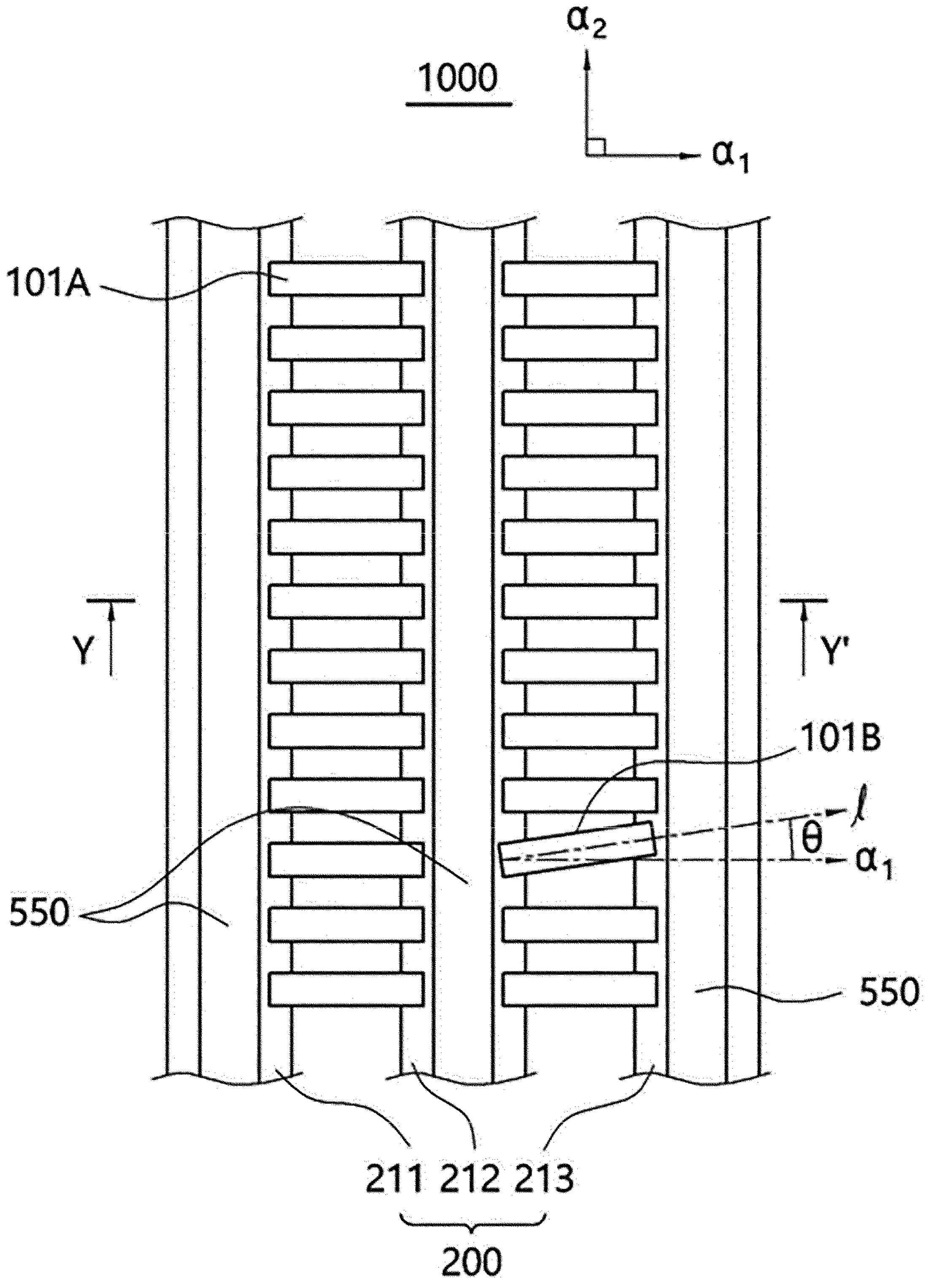
Figure 2:
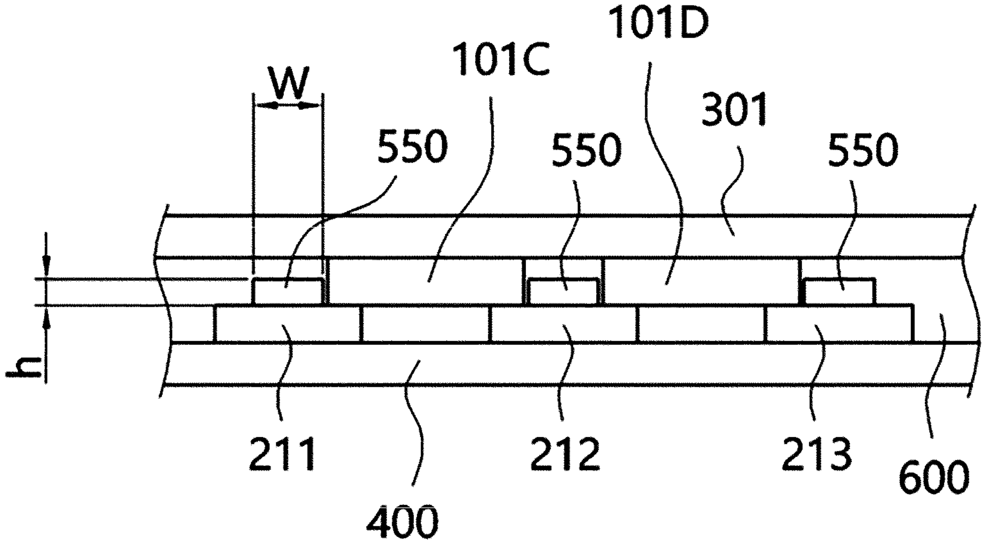

Referring to FIGS. 1 and 2, an ultra-thin fin light emitting diode (LED) electrode assembly 1000 according to an embodiment of the present invention includes a plurality of lower electrodes 211, 212, and 213 that extend in a first direction α2 and are spaced apart from each other in a second direction α1, an alignment guide 550 that is disposed on an upper surface of each of the plurality of lower electrodes 211, 212, and 213 and extends in the first direction α2 with a width smaller than a width of each of the lower electrodes 211, 212, and 213, a plurality of ultra-thin fin LED elements 101A, 101B, 101C, and 101D arranged in contact with the upper surfaces of the lower electrodes 211, 212, and 213, and an upper electrode line including an upper electrode 301 disposed on the ultra-thin fin LED elements 101A, 101B, 101C, and 101D.

The ultra-thin fin LED electrode assembly 1000 may be manufactured using a method of self-aligning the ultra-thin fin LED elements 101A, 101B, 101C, and 101D on the lower electrodes 211, 212, and 213 through a dielectrophoretic force using an electric field formed by assembly power applied to the lower electrodes 211, 212, and 213.

In detail, the ultra-thin fin LED electrode assembly 1000 according to the embodiment of the present invention may be implemented by a method including operation (1) of forming the alignment guide 550 extending in the first direction α2 with a width smaller than the width of each of the lower electrodes 211, 212, and 213 on the upper surface of each of the plurality of lower electrodes 211, 212, and 213 extending in the first direction α2 and spaced apart from each other in the second direction α2, operation (2) of self-aligning the ultra-thin fin LED elements 101A, 101B, 101C, and 101D such that both ends of the ultra-thin fin LED elements 101A, 101B, 101C, and 101D in a long axis direction are in contact with the upper surfaces of the two adjacent lower electrodes 211, 212, and 213 by inputting, onto the lower electrodes 211, 212, and 213, a solution including a plurality of ultra-thin fin LED elements 101A, 101B, 101C, and 101D of which an X axis is a long axis with respect to an x axis, a y axis and a z axis perpendicular to each other and in which a plurality of layers are laminated in a z axis direction and by applying the assembly power to the lower electrodes 211, 212, and 213, and operation (3) of forming the upper electrode line on the plurality of self-aligned ultra-thin fin LED elements 101A, 101B, 101C, and 101D.

First, in operation (1) according to the present invention, an operation of forming the alignment guide 550 extending in the first direction α2 with the width that is smaller than the width of each of the lower electrodes 211, 212, and 213 on the upper surface of each of the plurality of lower electrodes 211, 212, and 213 extending in the first direction α2 and spaced apart from each other is performed.

The lower electrodes 211, 212, and 213 serve as mounting electrodes on which the ultra-thin fin LED elements 101A, 101B, 101C, and 101D are to be mounted and function as one driving electrode together with the upper electrode 301. The plurality of lower electrodes 211, 212, and 213 may extend in the first direction α2, may be spaced apart from each other in a direction different from the first direction α2, and as an example, may be spaced apart from each other in the second direction α1 that is perpendicular to the first direction α2. In this case, intervals between the lower electrodes 211, 212, and 213 spaced apart from each other may be the same, or at least some of the intervals may be different from each other.

As an example, the intervals between the lower electrodes 211, 212, and 213 spaced apart from each other may be smaller than a length of each of the ultra-thin fin LED elements 101A, 101B, 101C, and 101D in a long axis direction. Therefore, mounting surfaces of the ultra-thin fin LED elements 101A, 101B, 101C, and 101D may be controlled to be a specific surface, the ultra-thin fin LED elements 101A, 101B, 101C, and 101D may be mounted with a small mounting angle deviation therebetween, and the mounted ultra-thin fin LED elements 101A, 101B, 101C, and 101D may be advantageously mounted on an adjacent lower electrode without bias. As an example, a separation distance between the adjacent lower electrodes may be 0.3 times to 0.7 times the length of the ultra-thin fin LED elements 101A, 101B, 101C, and 101D. However, when the separation distance between the two adjacent lower electrodes 211, 212, and 213 excessively decreases, an electrical short may occur due to assembly power for mounting the ultra-thin fin LED elements 101A, 101B, 101C, and 101D. In this case, as a current that should flow from one lower electrode to another adjacent lower electrode via the solvent directly flows between the two adjacent lower electrodes, the electric field that may induce the self-alignment of the ultra-thin fin LED elements 101A, 101B, 101C, and 101D is not properly formed, and accordingly, the self-alignment of the ultra-thin fin LED elements 101A, 101B, 101C, and 101D may not be achieved properly.

Further, the plurality of lower electrodes 211, 212, and 213 may include at least two lower electrodes that are not electrically connected to each other. Therefore, through operation (2) that will be described below, a high electric field may be formed between two adjacent lower electrodes 211, 212, and 213 by the assembly power applied to the lower electrodes 211, 212, and 213.

Meanwhile, only in operation (2) that will be described below, the lower electrodes 211, 213, and 214 function as mounting electrodes to which different types or power (e.g., a positive (+) power source and a negative (−) power source) between the adjacent lower electrodes 211, 212, and 213, and function as driving electrodes to which the same type of power (e.g., the positive (+) power source or the negative (−) power source) is applied when driving. Accordingly, when the ultra-thin fin LED electrode assembly 1000 is driven, the same type of power is applied to the lower electrodes 211, 213, and 214, thus the risk of electrical short between the lower electrodes 211, 212, and 213 decreases. Accordingly, when the lower electrodes 211, 212, and 213 are designed, the design may be performed such that the separation distance between the electrodes further decrease. On the other hand, the lower electrodes 211, 213, and 214 that are designed with a decreased separation distance at which an electrical short does not occur when the assembly power is applied may form a greater electric field between two adjacent lower electrodes by the assembly power applied when the lower electrodes 211, 213, and 214 are used as the mounting electrodes, and therefore, the alignment of the ultra-thin fin LED elements 101A, 101B, 101C, and 101D can be advantageously improved.

Further, the plurality of lower electrodes 211, 212, and 213 may form a lower electrode line 200, and the lower electrode line 200 may further include a widely-known electrode, which is required for driving, controlling, and repairing LED elements, such as a connection electrode or capacitor electrode that connects the lower electrodes 211, 212, and 213 to each other or connects the lower electrodes 211, 212, and 213 to another component such as a circuit board, in addition to the lower electrodes 211, 212, and 213.

Further, the lower electrodes 211, 212, and 213 may be formed on a base substrate 400. The base substrate 400 may function as a support that supports the lower electrode line 200, the upper electrode line, and the ultra-thin fin LED elements 101A, 101B, 101C, and 101D. The base substrate 400 may be any one selected from the group consisting of a glass, a plastic, a ceramic, and a metal, but the present invention is not limited thereto. Further, it is preferable that the base substrate 400 be formed of a transparent material to minimize loss of light emitted from the element. Further, the base substrate 400 may be formed of a flexible material. Further, the size and thickness of the base substrate 400 may be appropriately changed in consideration of the size and number of provided ultra-thin fin LED elements 101A, 101B, 101C, and 101D, a detailed design of the lower electrode line 200, and the like.

Further, the lower electrodes 211, 212, and 213 may have a material, a shape, a width, and a thickness of an electrode used in a general LED electrode assembly and may be manufactured using the widely-known method, and thus the present invention does not specifically limit this. As an example, the lower electrodes 211, 212, and 213 may be formed of aluminum, chrome, gold, silver, copper, graphene, ITO, or alloys thereof, a width thereof may be in a range of 2 μm to 50 μm, and a thickness thereof may be in a range of 0.1 μm to 100 μm. More preferably, the width may be in a range of 8 μm to 50 μm to minimize influence between adjacent lower electrodes 211, 212, and 213. However, the width and thickness of the lower electrodes 211, 212, and 213 may be appropriately changed in consideration of the size of the desired LED electrode assembly.

Next, a process of forming the alignment guide 550 on the upper surfaces of the formed lower electrodes 211, 212, and 213 is performed.

The alignment guide 550 may improve alignment of the ultra-thin fin LED elements 101A, 101B, 101C, and 101D that are self-aligned in operation (2) that will be described below and thus may allow a large number of ultra-thin fin LED elements 101A, 101B, 101C, and 101D to be mounted within a limited electrode area in which the ultra-thin fin LED elements 101A, 101B, 101C, and 101D may be mounted. Through this intensive mounting, luminance per unit area can greatly increase. Further, the improvement of the element alignment ensures stable contact between the lower electrode and both ends of the ultra-thin fin LED elements 101A, 101B, 101C, and 101D in a long axis direction, facilitates the formation of the upper electrode, and enables various designs of various upper electrodes.

Figure 7:
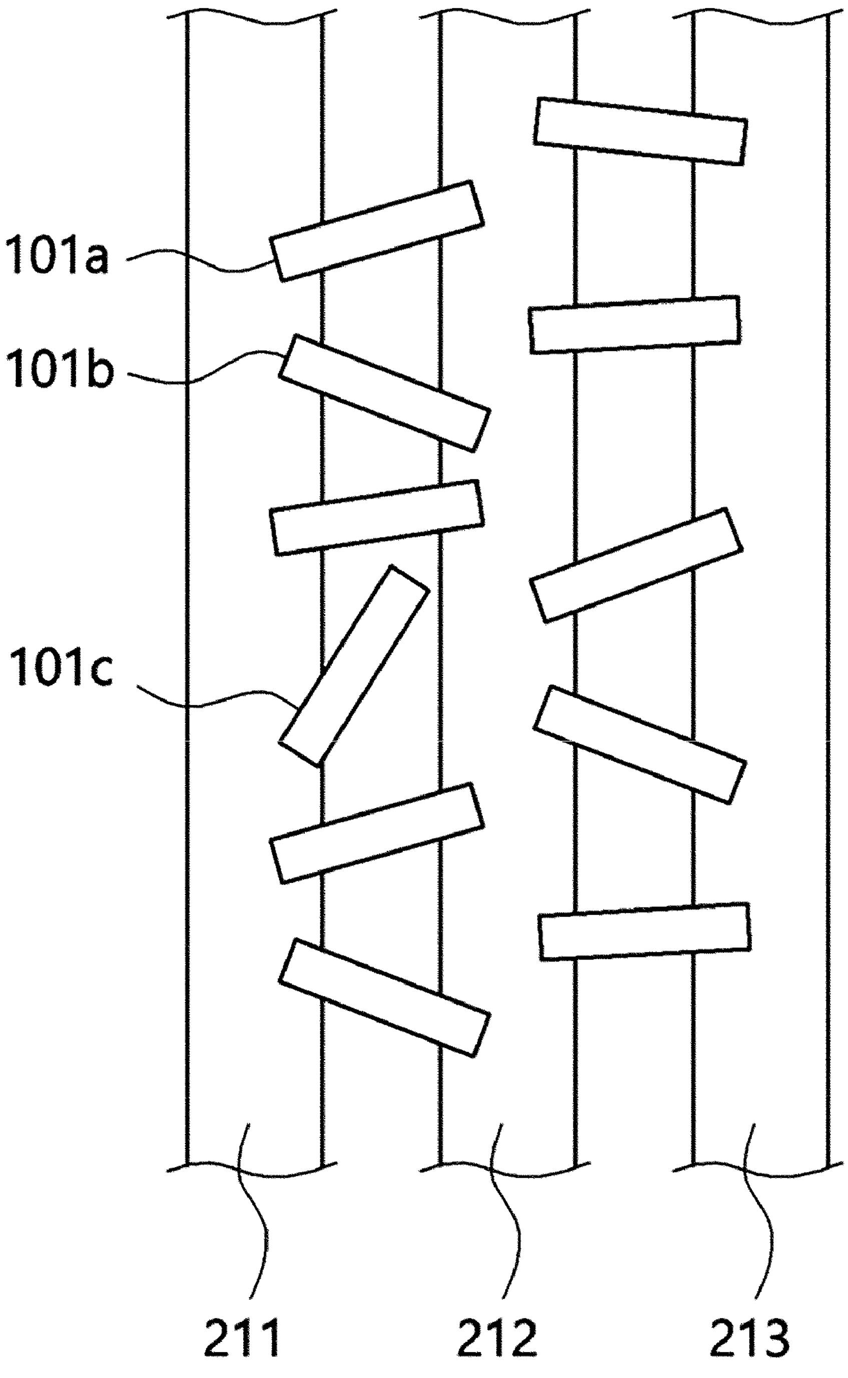
FIG. 7 is a schematic view of the ultra-thin fin LED element aligned after assembly power is applied to a lower electrode on which no alignment guide is formed.

In detail, as in the ultra-thin fin LED elements 101A, 101B, 101C, and 101D adopted in the present invention, FIG. 7 illustrates LED elements 101*a*, 101*b*, and 101*c* of which a length in one direction is greater than a length in the other direction and which are mounted on the lower electrodes 211, 212, and 213 through a dielectrophoretic force. As already known, the LED element may be aligned on two electrodes that form an electric field using a dielectrophoretic force. While continuously researching the alignment of the LED elements, the inventor of the present invention found that the alignment of the mounted LED element is very irregular by simply adjusting an intensity of the assembly power as illustrated in FIG. 7, the number of elements mounted per electrode area on which the LED elements may be mounted changes so that the luminance may be uneven depending on a position, and the LED elements mounted with low directivity have a large area that occupies the electrode area on which the LED elements may be mounted, the number of LED elements that may be mounted is greatly reduced, and thus low luminance itself is exhibited. Furthermore, in addition of being mounted in irregular directivity, in some cases, the LED elements are mounted in a state in which only one end of the ultra-thin fin LED element 101*c* in a longitudinal direction is in contact with the lower electrode 211 and the other end thereof is directed toward the other lower electrode 212 but is not in contact with the other lower electrode 212. In this case, it is difficult to stably form the upper electrode on the mounted LED element, and the quality of the formed upper electrode may be degraded. Further, a contact area with the lower electrode is small, a contact failure may easily occur, and there is a risk that light is not emitted during driving.

Accordingly, while continuously researching on improvement of the alignment in which an aligned direction is controlled when the ultra-thin fin LED element is mounted on the lower electrode, the inventor of the present invention discovered that, when the alignment guide is formed on the upper surface of the lower electrode, a difference between intensities of the electric field formed between two adjacent lower electrodes according to each position increases, and thus the alignment of the ultra-thin fin LED element can be greatly improved. Thus, the inventor led to the present invention.

In detail, the alignment guide 550 is formed on the upper surfaces of the lower electrodes 211,212 and 213 along the lower electrodes 211, 212, and 213 in the first direction $\alpha 2$ that is an extension direction of each of the plurality of lower electrodes 211, 212, and 213. In this case, a width w of the formed alignment guide 550 is formed smaller than a width of each of the lower electrodes 211, 212, and 213 on which the alignment guide 550 of each of the lower electrodes 211, 212, and 213 is formed, and thus an electrode surface with which the ultra-thin fin LED element may be in contact can be ensured. To this end, preferably, the lower electrodes 211, 212, and 213 may be formed to extend in the first direction $\alpha 2$ to correspond to a central portion in the second direction $\alpha 1$ that is a width direction thereof. In detail, the upper surfaces of the lower electrodes 211, 212, and 213 may be divided into three areas in the second direction $\alpha 1$, the alignment guide 550 may be formed at a central portion corresponding to a middle area among the three areas, and the upper surfaces of the lower electrodes corresponding to both sides of the alignment guide 550 may be contactable surfaces with which the ultra-thin fin LED element may be in contact. Further, it is preferable that the width w of the alignment guide 550 be formed to be smaller than or equal to a half of the width of the lower electrode. Therefore, it is advantageous to ensure contactable areas of the upper surfaces of the lower electrodes 211, 212, and 213, with which ends of the ultra-thin fin LED elements 101A, 101B, 101C, and 101D may be sufficiently in contact.

Further, a height h of the alignment guide 550 may be smaller than or equal to a length in a z-axis direction, which corresponds to a thickness of the ultra-thin fin LED element. When the height of the alignment guide 550 is greater than the thickness of the ultra-thin fin LED element, it may not be easy to form the upper electrode line on the mounted ultra-thin fin LED element in operation (3), which will be described below.

The alignment guide 550 may be formed through a widely-known method of forming an alignment guide forming material having a predetermined dielectric constant in a predetermined width and height on the upper surfaces of the lower electrodes 211, 212, and 213. As an example, after coating or deposition is performed through the widely known method, the alignment guide 550 may be manufactured through a patterning and etching process such that the alignment guide 550 has a smaller width than those of the upper surfaces of the lower electrodes. In detail, when the alignment guide forming material is an inorganic material, the alignment guide may be formed by any one method among a chemical vapor deposition method, an atomic layer deposition method, a vacuum deposition method, an c-beam deposition method, and a spin coating method. Alternatively, when the alignment guide forming material is an organic material that is a polymer, the alignment guide may be formed using coating methods such as spin coating, spray coating, and screen printing. Further, the patterning may be formed through photolithography using a photosensitive material or may be achieved by nanoimprinting methods, laser interference lithography, electron beam lithography, or the like which is widely known.

Meanwhile, the improvement in the alignment of the ultra-thin fin LED element is not caused by structural characteristics of the alignment guide 550. That is, the alignment guide 550 may physically help to intensively mount the ultra-thin fin LED elements in an area between two adjacent alignment guides 550, for example, an area between the two alignment guides 550 formed on the first lower electrode 211 and the second lower electrode 212, but cannot control mounting directivity of the ultra-thin fin LED elements that are intensively mounted. As a result, the reason why the alignment of the ultra-thin fin LED element is improved is caused by dielectric properties between a solvent that forms a solution including the ultra-thin fin LED elements and a material that forms the alignment guide 550 in operation (2) which will be described below. Accordingly, a difference between intensities of the electric field according to each position may increase. Therefore, the directions in which the ultra-thin fin LED elements are mounted are substantially the same. In detail, the ultra-thin fin LED elements may be aligned such that a long axis direction (thereof is substantially perpendicular to the first direction $\alpha$2 or is actually perpendicular to the first direction $\alpha$2.

Figure 8:
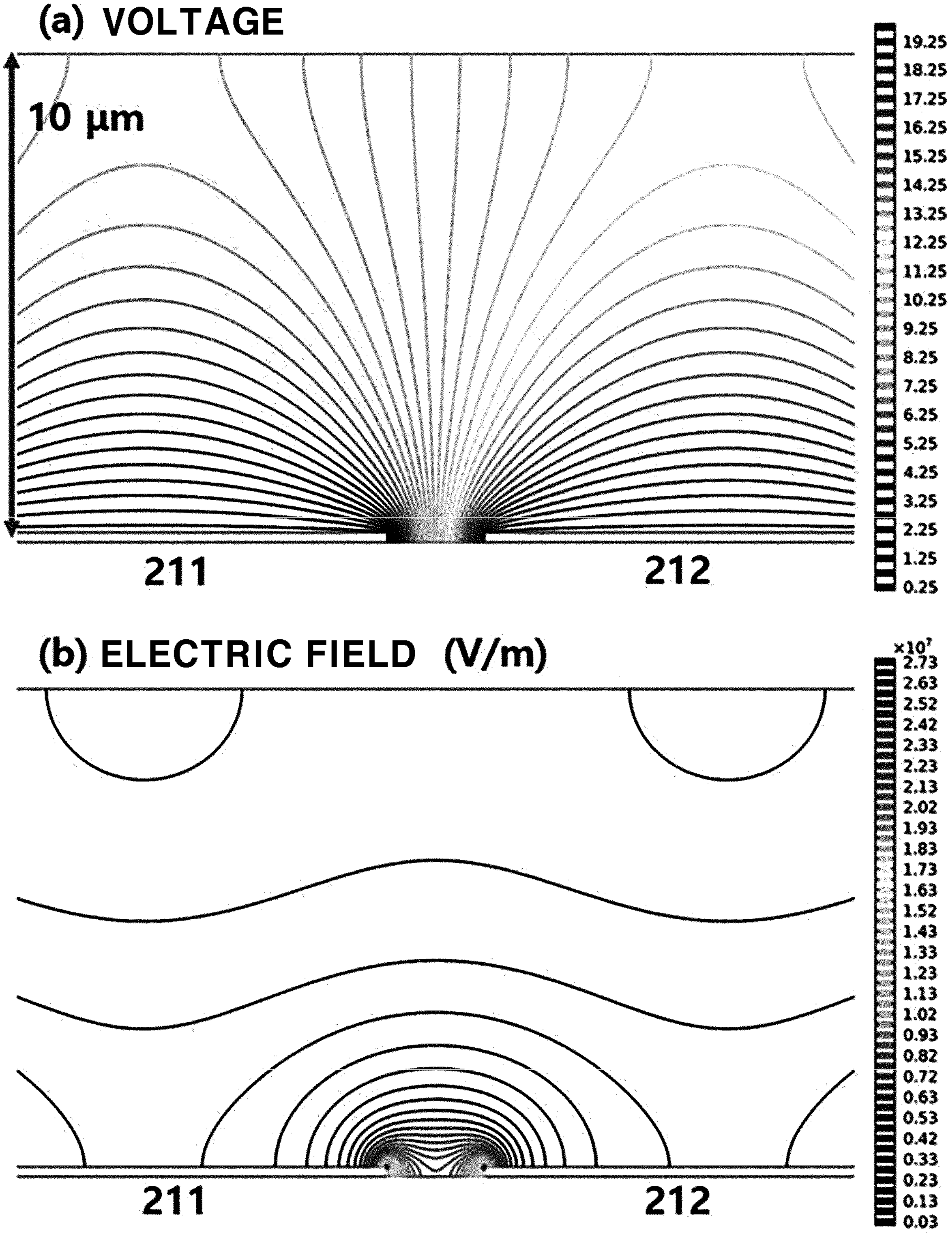
FIGS. 8 and 9 illustrate simulation results of electric fields formed in two lower electrodes (211, 212) when assembly power having 40 Vpp and 10 Khz is applied to the lower electrodes (211, 212) in a state of being filled with a solvent having a dielectric constant of 20.7, wherein FIGS. 8 (*a*) and 9 (*b*) are contour lines of magnitudes of voltages, and FIGS. 8 (*b*) and 9 (*b*) are contour lines of strengths of electric fields.
Figure 9:
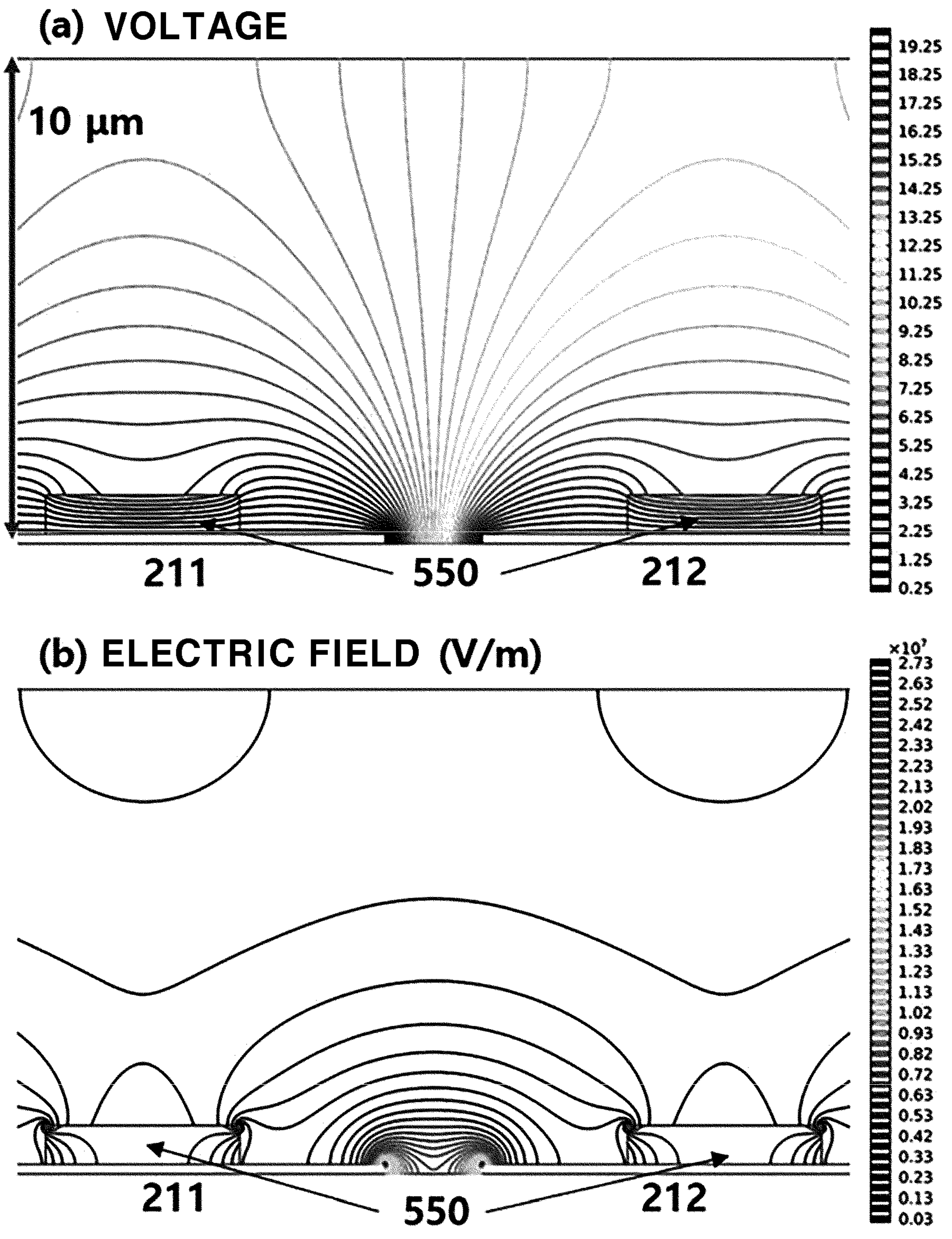

In description of this with reference to FIGS. 8 and 9, FIGS. 8 and 9 illustrate contour lines of magnitudes of voltages (see FIGS. 8A and 9A) and contour lines of strengths of electric fields (see FIGS. 8B and 9B) formed in two lower electrodes 211 and 212 when assembly power having 40 Vpp and 10 Khz is applied to the lower electrodes 211 and 212 in a state in which the upper areas of the two lower electrodes 211 and 212 having a thickness of 0.2 μm and a separation distance 2 μm (areas at a height of 10 μm from the ground on which the lower electrode is formed) are filled with a solvent having a dielectric constant of 20.7.

Referring to FIG. 8, even when the alignment guide is not formed, points at which the intensity of the electric field formed in the lower electrodes 211 and 212 is strongest are adjacent to side surfaces on which the two lower electrodes 211 and 212 face each other, and especially are upper edges of the side surfaces. Accordingly, the ultra-thin fin LED element is mounted by being simultaneously drawn to the upper edges of the side surfaces on which the two lower electrodes 211 and 212 face each other, and as a result, the ultra-thin fin LED element may be mounted to be placed between the two lower electrodes 211 and 212. However, as illustrated in FIG. 7, it can be identified that, even when the entire ultra-thin fin LED element does not span the two lower electrodes 211 and 212 and only one end thereof spans one lower electrode or the two lower electrodes 211 and 212, the ultra-thin fin LED element may be mounted in different long axis directions.

However, as can be identified in FIG. 9, when the alignment guides 550 (having a width of 4 μm and a height of 0.8 μm) made of $SiO_2$ are arranged on the upper surfaces of the lower electrodes 211 and 212, the intensity of the electric field at the upper edges of the side surfaces on which the two lower electrodes 211 and 212 face each other increases significantly compared to FIG. 8, and a difference between the intensities of the electric field according to each position also increases much larger. Accordingly, the ultra-thin fin LED element is more strongly drawn to the upper edges of the side surfaces on which the two lower electrodes 211 and 212 face each other, and in addition, may be aligned such that the long axis direction (of the ultra-thin fin LED element is substantially perpendicular to the first direction $\alpha$2 that is the extension direction of the lower electrodes 211 and 212.

Meanwhile, the improvement in the alignment of the ultra-thin fin LED element due to the presence of the alignment guide 550 as illustrated in FIG. 9 can be further maximized by adjusting the dielectric properties between the solvent and the alignment guide 550. In detail, FIGS. 10A to 10C are results of simulating a change in an intensity of an electric field formed between the two lower electrodes 211 and 212 depending on the position (width direction (X-axis) and height (y-axis) of the lower electrodes 211 and 212) when the ultra-thin fin LED element in a solvent having a specific dielectric constant is drawn from the upper areas of the lower electrodes 211 and 212 to the lower electrodes 211 and 212 when the alignment guide 550 is formed as illustrated in FIG. 9.

Figure 10A:
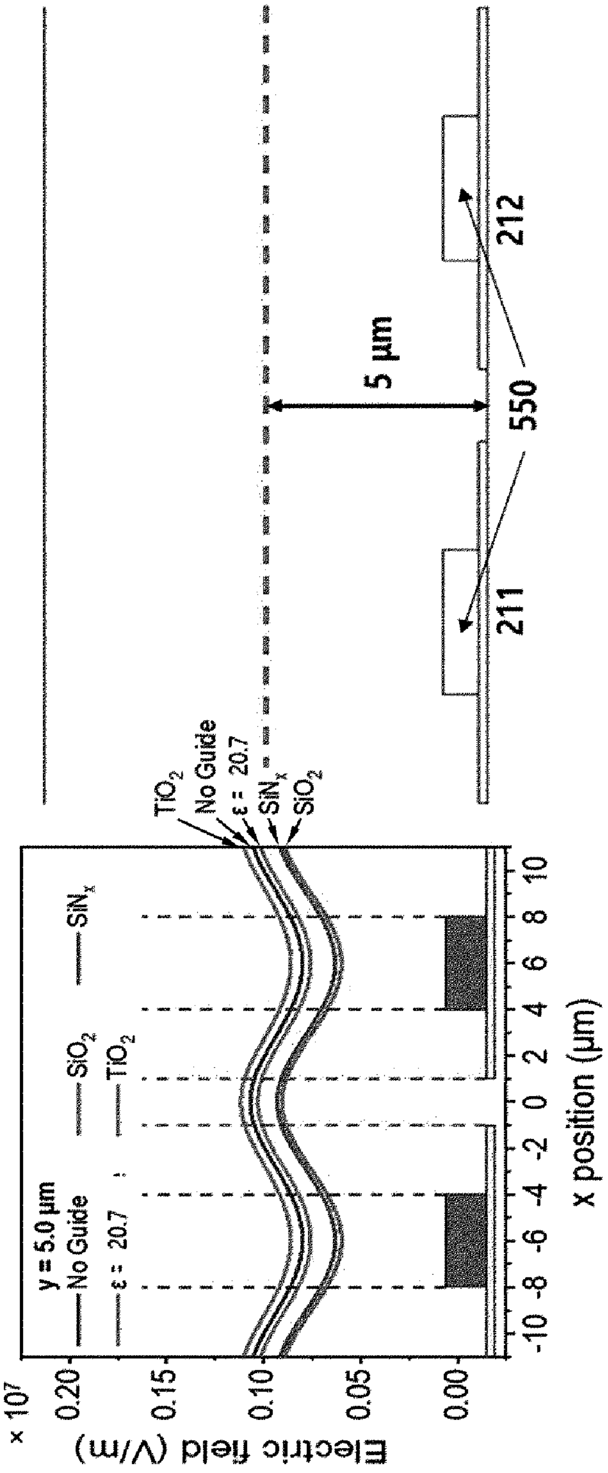
FIGS. 10A to 10C are results of simulating a change intensity of an electric field formed between the two lower electrodes (211, 212) depending on positions (width direction (X-axis) and height (y-axis) of the lower electrodes (211, 212)) by using different types of alignment guides when the ultra-thin fin LED element in a solvent having a specific dielectric constant is drawn from upper areas of the lower electrodes (211, 212) to the lower electrodes (211, 212)

In detail, as can be identified in FIG. 10A, a difference between the intensities of the electric field at a central point (−6.0 based on the x axis) of the left alignment guide 550, a central point (+6.0 based on the x axis) of the right alignment guide 550 and a central point (0.0 based on the x axis) between the two lower electrodes 211 and 212 is not large regardless of the type of alignment guide 550 at a position of 5 μm from the ground on which the lower electrodes 211 and 212 are formed. However, as illustrated in FIG. 10B, it can be identified that the intensity of the electric field on the alignment guide 550 is weaker than that in FIG. 10A at a position of 2 μm from the ground on which the lower electrodes 211 and 212 are formed, but the intensity of the electric field increases toward the central point (0.0 based on the x axis) between the two lower electrodes 211 and 212, and thus the difference between the intensities of the electric field at the central point (−6.0 based on the x axis) of the left alignment guide 550, the central point (+6.0 based on the x axis) of the right alignment guide 550 and the central point (0.0 based on the x axis) between the two lower electrodes 211 and 212 further increases.

Accordingly, it can be expected that the ultra-thin fin LED element that is drawn toward the lower electrode is strongly drawn between the two lower electrodes 211 and 212 that have a large difference between the intensities of the electric field.

Figure 10B:
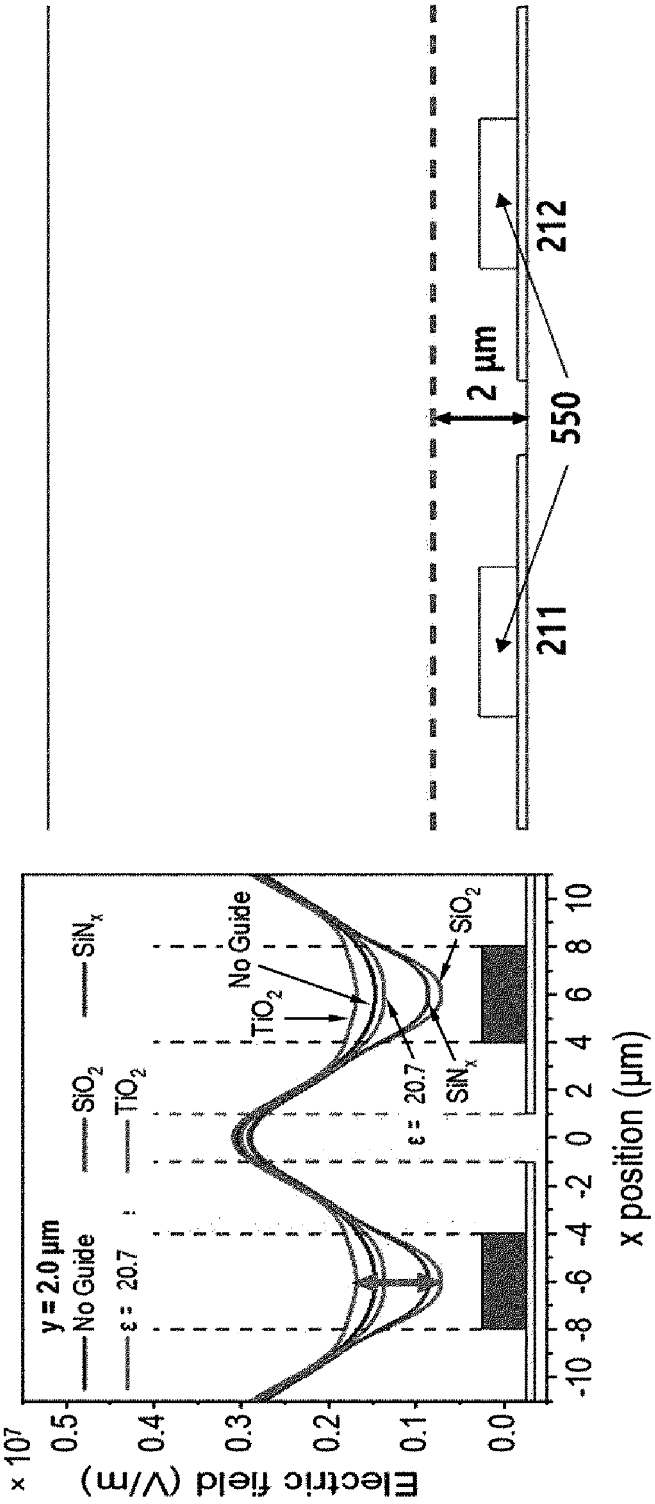
Figure 10C:
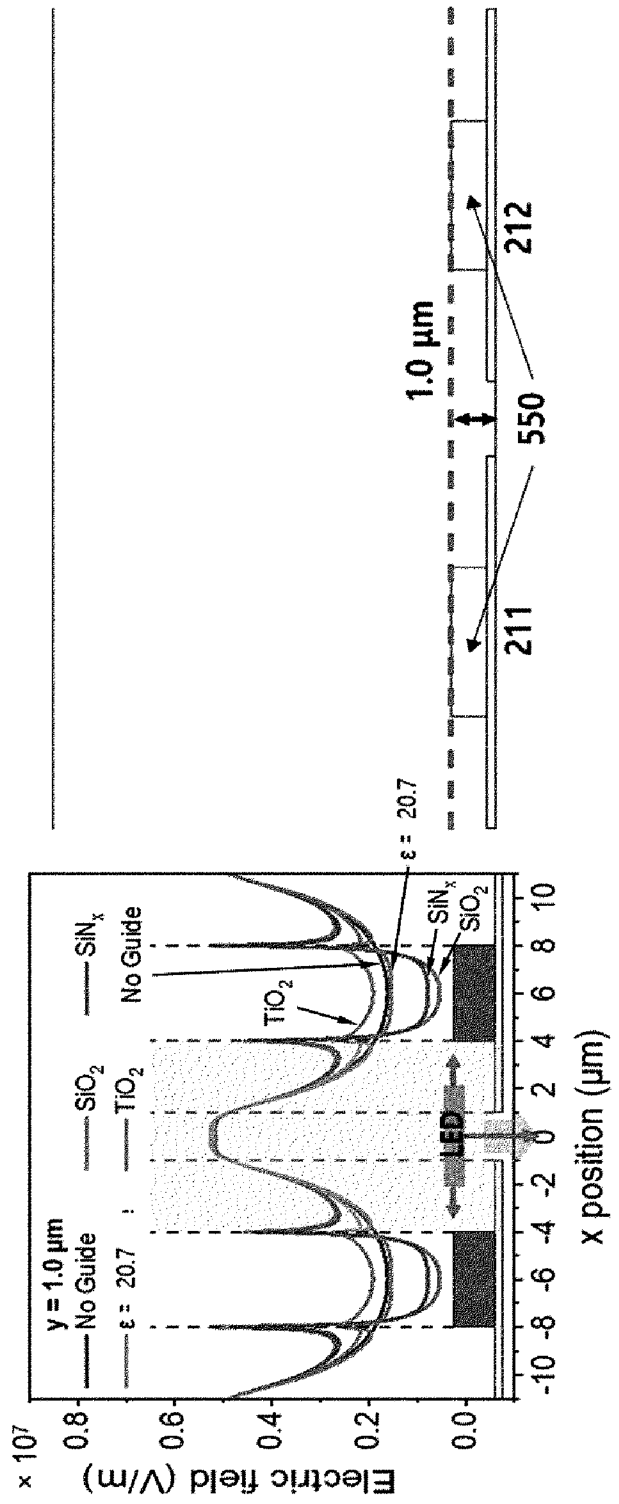

Meanwhile, it can be identified that when dielectric properties of the alignment guide 550 formed through FIGS. 10A and 10B change, the difference between the intensity of the electric field on the alignment guide and the intensity of the electric field at the central point (0.0 based on the x axis) between the two lower electrodes 211 and 212 varies greatly, and thus a difference in a force with which the ultra-thin fin LED element is drawn between the two lower electrodes 211 and 212 changes depending on a difference between dielectric properties of the solvent and the alignment guide 550. In detail, it can be expected that as compared to a case in which the alignment guide 550 is formed of a material having the same dielectric constant as the dielectric constant of the solvent, when the alignment guide is not formed or the alignment guide made of a TiO2 material is formed, the force with which the ultra-thin fin LED element is drawn between the two lower electrodes 211 and 212 is similar or rather small. In contrast, when the alignment guide is formed of $SiO_2$ or $SiN_x$, the force with which the ultra-thin fin LED element is drawn between the two lower electrodes 211 and 212 is formed much larger than a case in which there is no alignment guide. As a result, it can be expected that, even when there is no alignment guide 550 or the alignment guide 550 is present, when the alignment guide 550 is formed of $SiO_2$ or $SiN_x$ having a dielectric constant smaller than that of the solvent, the alignment of the ultra-thin fin LED element is significantly excellent as compared to a case in which the alignment guide 550 is formed of a material having the same dielectric constant as that of the solvent or formed of $TiO_2$ having a dielectric constant greater than that of the solvent.

Further, as can be identified in FIG. 10C, unlike FIG. 10B, the intensity of the electric field at an edge of the alignment guide 550 at a position of 1 μm from the ground on which the lower electrodes 211 and 212 are formed increases significantly, but the trend of the intensity of the electric field at different positions is similar. Further, even when the intensity of the electric filed at the edge of the alignment guide 550 increases significantly, since the intensity of the electric field is still smaller than the intensity of the electric field between the two lower electrodes 211 and 212, it is difficult to hinder the movement of the ultra-thin fin LED electrode that is strongly drawn between the two lower electrodes 211 and 212, and as a result, the alignment of the ultra-thin fin LED element is the same as that of FIG. 10B.

As a result, when operations (1) and (2) according to the present invention are configured through FIGS. 10A to 10C so that a dielectric constant $\varepsilon 1$ of the solvent is greater than a dielectric constant $\varepsilon 2$ of the alignment guide 550, the long axis direction of the ultra-thin fin LED element may be arranged almost perpendicular to the first direction $\alpha 2$ that is an extension direction of the lower electrodes 211, 212, and 213, and at the same time, a mounting area occupied by one ultra-thin fin LED element is reduced. Thus, the ultra-thin fin LED element may be arranged more intensively. The dielectric constant $\varepsilon 1$ of the solvent may be greater than the dielectric constant ($\varepsilon 2$) of the alignment guide 550 preferably by 3.0 or more, more preferably, by 5.0 or more, and further more preferably, by 10.0 or more. Therefore, the alignment and intensive arrangement of the ultra-thin fin LED element, specifically, a ratio of the ultra-thin fin LED elements that are mounted at a mounting angle $\theta$ of 10° or less, more preferably, at a mounting angle $\theta$ of 5° or less, which will be described below, can be further improved. As another example, the dielectric constant $\varepsilon 1$ of the solvent may be greater than the dielectric constant $\varepsilon 2$ of the alignment guide 550 by 80.0 or less.

Further, the lower electrode line 200 may further include a partition wall (not illustrated) that prevents the ultra-thin fin LED element input in operation (2), which will be described below, from flowing to areas other than a targeted area and includes a side wall that divides some or all of the lower electrodes 211, 212, and 213 into one area or a plurality of areas at a certain height to surround the divided area in order to intensively arrange the ultra-thin fin LED elements 101A, 101B, 101C, and 101D on the targeted area. A solution including the ultra-thin fin LED element 101A, 101B, 101C, and 101D may be input into the partition wall. The partition wall may be formed of an insulating material so that a final LED electrode assembly implemented with the mounted ultra-thin fin LED element is not electrically affected when the ultra-thin fin LED element is driven. Preferably, the insulating material may be one or more of inorganic insulators such as silicon dioxide ($SiO_2$), silicon nitride ($Si_3N_4$), aluminum oxide ($Al_2O_3$), hafnium oxide ($HfO_2$), yttrium oxide ($Y_2O_3$), and titanium dioxide ($TiO_2$) and various transparent polymer insulators. Further, the partition wall may be manufactured by forming the insulating material on the lower electrode line 200 at a certain height and then performing patterning and etching to form a side wall surrounding the targeted area.

In this case, when the material of the partition wall is an inorganic insulator, the partition wall may be formed by one method among a chemical vapor deposition method, an atomic layer deposition method, a vacuum deposition method, an e-beam deposition method, and a spin coating method. Further, when the material of the partition wall is a polymer insulator, the partition wall may be formed using coating methods such as spin coating, spray coating, and screen printing. Further, the patterning may be formed through photolithography using a photosensitive material or may be achieved by nanoimprinting methods, laser interference lithography, electron beam lithography, or the like which is widely known. A height of the partition wall formed in this case is a half or more of the thickness of the ultra-thin fin LED elements 101A, 101B, 101C, and 101D, is generally a thickness that may not affect a post-process such as operation (3), and may be preferably in a range of 0.1 μm to 100 μm, and more preferably in a range of 0.3 μm to 10 μm. When the above range is not satisfied, the post-process such as operation (3) is affected, making it difficult to manufacture the ultra-thin fin LED electrode assembly. In particular, when the thickness of the insulator is too thin compared to the thickness of the ultra-thin fin LED elements 101A, 101B, 101C, and 101D, there is a risk that a solution such as an ink composition including the ultra-thin fin LED elements 101A, 101B, 101C, and 101D may overflow outside the partition wall. Thus, it is difficult to prevent the ultra-thin fin LED element from spreading out of the partition wall through partition wall.

Further, an appropriate etching method may be adopted for the etching in consideration of the material of the insulator, as an example, the etching may be performed through a wet etching method or a dry etching method, and the etching may be preferably performed by one or more dry etching methods among plasma etching, sputter etching, reactive ion etching, and reactive ion beam etching.

Next, in operation (2) according to the present invention, the ultra-thin fin LED elements 101A, 101B, 101C, and 101D are self-aligned such that both ends of the ultra-thin fin LED elements 101A, 101B, 101C, and 101D in the long axis direction are in contact with the upper surfaces of the two adjacent lower electrodes 211, 212, and 213 by inputting, onto the lower electrodes 211, 212, and 213, the solution including the plurality of ultra-thin fin LED elements 101A, 101B, 101C, and 101D of which the X axis is a long axis with respect to the x axis, the y axis and the z axis perpendicular to each other and in which a plurality of layers are laminated in the z axis direction and by applying the assembly power to the lower electrodes 211, 212, and 213.

Referring to FIGS. 3 to 6, the ultra-thin fin LED elements 101A, 101B, 101C, and 101D used in operation (2) correspond to rod-type ultra-thin fin LED elements 101, 102, and 103 in which, with respect to the x axis, the y axis, and the z axis perpendicular to each other, a plurality of layers 10, 20, 30, 40, and 60 to be included therein are laminated in the z axis direction, a length in the x axis direction is greater than a width that is a length in the y axis direction or a thickness that is a length in the z axis direction, and thus the x axis direction is a long axis of the ultra-thin fin LED elements 101, 102, and 103.

In detail, the ultra-thin fin LED elements 101, 102, and 103 may include a minimum number of layers for generally functioning as LED elements. As an example, the minimum layers may include conductive semiconductor layers 10 and 30 and a photoactive layer 20.

The conductive semiconductor layers 10 and 30 may be used without limitation as long as the conductive semiconductor layers 10 and 30 are conductive semiconductor layers employed in the general LED element that is used in light sources such as a light and a display. According to an exemplary embodiment of the present invention, the ultra-thin fin LED elements 101, 102, and 103 may include a first conductive semiconductor layer 10 and a second conductive semiconductor layer 30. In this case, one of the first conductive semiconductor layer 10 and the second conductive semiconductor layer 30 may include at least one n-type semiconductor layer, and the other one thereof may include at least one p-type semiconductor layer.

When the first conductive semiconductor layer 10 includes the n-type semiconductor layer, the n-type semiconductor layer may be one or more selected from, for example, InAlGaN, GaN, AlGaN, InGaN, AlN, and InN that are semiconductor materials having a composition formula of $In_xAl_yGa_{1-x-y}N$ ($0 \le x \le 1$, $0 \le y \le 1$, and $0 \le x+y \le 1$) and may be doped with a first conductive dopant (e.g., Si, Ge, Sn or the like). According to an exemplary embodiment of the present invention, the first conductive semiconductor layer 10 including the n-type semiconductor layer may be in a range of 0.2 μm to 3 μm, but the present invention is not limited thereto.

Further, when the second conductive semiconductor layer 30 includes the p-type semiconductor layer, the p-type semiconductor layer may be one or more selected from, for example, InAlGaN, GaN, AlGaN, InGaN, AlN, and InN that are semiconductor materials having a composition formula of $In_xAl_yGa_{1-x-y}N$ ($0 \le x \le 1$, $0 \le y \le 1$, and $0 \le x+y \le 1$) and may be doped with a second conductive dopant (e.g., Mg). According to an exemplary implementation of the present invention, a thickness of the second conductive semiconductor layer 30 including the p-type semiconductor layer may be in a range of 0.01 μm to 0.35 μm, but the present invention is not limited thereto.

Next, the photoactive layer 20 may be formed between the first conductive semiconductor layer 10 and the second conductive semiconductor layer 30 and may be formed in a single or multiple quantum well structure. The photoactive layer 20 may be used without limitation as long as the photoactive layer 20 is a photoactive layer included in a general LED element used for a light, a display, or the like. A clad layer (not illustrated) doped with a conductive dopant may be formed on and/or under the photoactive layer 20, and the clad layer doped with the conductive dopant may be implemented as an AlGaN layer or an InAlGaN layer. In addition, materials such as AlGaN and AlInGaN may also be used as the photoactive layer 20. In the photoactive layer 20, when the electric field is applied to the element, electrons and holes moving from the conductive semiconductor layers positioned on or under the photoactive layer to the photoactive layer are combined in electron-hole pairs in the photoactive layer, thereby emitting lights. According to an exemplary embodiment of the present invention, a thickness of the photoactive layer 20 may be in a range of 30 nm to 300 nm, but the present invention is not limited thereto.

Further, it is illustrated that the ultra-thin fin LED elements 101, 102, and 103 includes the first conductive semiconductor layer 10, the photoactive layer 20, and the second conductive semiconductor layer 30 as minimum components. In addition, other active layers, other conductive semiconductor layers, other phosphor layers, other hole block layers, and/or other electrode layers may be further included on/under each layer.

As an example, the electrode layer 40 may be used without limitation as long as the electrode layer 40 is a general electrode layer provided in the LED element. As a non-limiting example, materials such as Cr, Ti, Al, Au, Ni, ZnO, AZO, and ITO, oxides thereof or alloys thereof may be used alone or mixedly. Further, a thickness of the electrode layer 40 may be in a range of 10 nm to 500 nm, but the present invention is not limited thereto.

Further, an electronic delay layer 60 having an electronic delay function may be provided under the first conductive semiconductor layer 10. In the ultra-thin fin LED element 102, as a thickness of each layer in a laminating direction is smaller than a length thereof, a thickness of the n-type GaN layer has no choice but to be relatively thin. In contrast, since a moving speed of electrons is greater than a moving speed of holes, the electrons and the holes are combined on the second conductive semiconductor layer 30 not on the photoactive layer 20, and thus a light emitting efficiency may be degraded. The electronic delay layer 60 may prevent a decrease in the light emitting efficiency by balancing the number of recombined holes and electrons in the photoactive layer 20. The electronic delay layer 60 may contain one or more selected from the group consisting of CdS, GaS, ZnS, CdSe, CaSe, ZnSe, CdTe, GaTe, SiC, ZnO, ZnMgO, $SnO_2$, $TiO_2$, $In_2O_3$, $Ga_2O_3$, Si, poly(paraphenylene vinylene), a derivative thereof, polyaniline, poly(3-alkylthiophene), and poly(paraphenylene). Alternatively, when the electronic delay layer 60 is an n-type III-nitride semiconductor layer doped with the first conductive semiconductor layer 10, the electronic delay layer 60 may be made of a III-nitride semiconductor having a doping concentration that is smaller than that of the first conductive semiconductor layer 10. Further, a thickness of the electronic delay layer 60 may be in a range of 1 nm to 100 nm, but the present invention is not limited thereto, and the thickness of the electronic delay layer 60 may be appropriately changed in consideration of a material of the n-type conductive semiconductor layer, a material of the electronic delay layer, or the like.

Further, when a surface parallel to the laminating direction is referred to as a side surface, the ultra-thin fin LED elements 101, 102, and 103 may further include a protective film 50 that surrounds the side surface of the elements. The protective film 50 functions to protect surfaces of the first conductive semiconductor layer 10, the photoactive layer 20, and the second conductive semiconductor layer 30. As an example, the protective film 50 may include one or more of silicon nitride ($Si_3N_4$), silicon dioxide ($SiO_2$), aluminum oxide ($Al_2O_3$), hafnium oxide ($HfO_2$), zirconium oxide ($ZrO_2$), yttrium oxide ($Y_2O_3$), titanium dioxide ($TiO_2$), aluminum nitride (AlN), and gallium nitride (GaN). A thickness of the protective film 50 may be in a range of 5 nm to 100 nm, more preferably, 30 nm to 100 nm, and therefore side surfaces of the ultra-thin fin LED element may be advantageously protected from external physical stimulation.

Further, an aspect ratio a/b of a length a of the long axis of the ultra-thin fin LED elements 101A, 101B, 101C, and 101D to a larger one between a width that is a length in the y axis direction and a thickness that is a length in the z axis direction is 3.0 or more, more preferably, 6.0 or more. Therefore, the ultra-thin fin LED elements 101A, 101B, 101C, and 101D input by a dielectrophoretic force through the electric field formed through the assembly power applied in operation (2), which will be described below, may be easily and intensively arranged on the lower electrodes 211, 212, 213, and 214 with improved alignment. When the aspect ratio is less than 3.0, as described above, the alignment guide 550 is provided, and even when a dielectric constant between the alignment guide 550 and the solvent is adjusted, the alignment cannot be improved to a desired level or the ultra-thin fin LED element cannot be intensively arranged. Meanwhile, the aspect ratio may be 15 or less, more preferably, 10 or less, and therefore, the purpose of the present invention, such as optimizing a rotational force that may perform the self-aligning using the electric field, may be advantageously achieved.

Meanwhile, in the ultra-thin fin LED elements 101A, 101B, 101C, and 101D, an x-y plane is illustrated as a rectangular shape in FIGS. 3 to 6, but the present invention is not limited thereto. Further, it should be noted that a general quadrangular shape such as a diamond, a parallelogram, and a trapezoid and an elliptical shape may be adopted as the x-y plane without limitation.

Further, the ultra-thin fin LED elements 101A, 101B, 101C, and 101D have a length and a width in micro or nano units, and as an example, the length of the ultra-thin fin LED elements 101A, 101B, 101C, and 101D may be in a range of 1 μm to 10 μm, and the width thereof may be 0.25 μm to 1.5 μm. Further, a thickness thereof may be in a range of 0.1 μm to 3 μm. The length and width may have different standards depending on the shape of the plane. As an example, when the x-y plane has a diamond shape or a parallelogrammic shape, one of two diagonals may be the length, and the other one thereof may be the width. When the x-y plane has a trapezoidal shape, the length may be a larger one among a height, an upper side, and a lower side, and the width may be a shorter one thereamong that is perpendicular to the larger one. Alternatively, when the shape of the plane is an ellipse, a long axis of the ellipse may be the length, and a short axis thereof may be the width.

Further, the ultra-thin fin LED elements 101A, 101B, 101C, and 101D are input onto the lower electrodes 211, 212, and 213 in a solution state in which the ultra-thin fin LED elements 101A, 101B, 101C, and 101D are dispersed in the solvent. In this case, the solvent not only functions as a dispersion medium that disperses the ultra-thin fin LED elements 101A, 101B, 101C, and 101D but also function to move the ultra-thin fin LED elements 101A, 101B, 101C, and 101D toward the lower electrode as a dielectrophoretic force received by the ultra-thin fin LED elements 101A, 101B, 101C, and 101D is affected by the electric field formed in the lower electrodes 211, 212, 213, and 214. The solvent may be used without limitation as long as the solvent may preferably increase dispersibility of the ultra-thin fin LED element and mobility by the dielectrophoretic force without causing physical or chemical damage to the ultra-thin fin LED element. However, as described above, the solvent should be appropriately selected in consideration of the dielectric properties of the alignment guide, and preferably, the solvent may have a dielectric constant of 30 or less, as another example, 28 or less. Further, preferably, the solvent may have a dielectric constant of 10.0 or more, and therefore, the purpose of the present invention may be achieved more advantageously. Meanwhile, examples of the solvent that satisfies the above dielectric constant may include, for example, acetone, isopropyl alcohol, and the like. Further, the solution containing the ultra-thin fin LED element may contain 0.01% to 99.99% by weight of the ultra-thin fin LED element in the solution, and the present invention is not particularly limited thereto. Further, the solution may be in the form of ink or paste.

Meanwhile, in operation (2), the solution may be treated on the lower electrodes 211, 212, and 213 through a widely known method, and a printer device such as an inkjet printer may be used to apply the solution for mass production. Further, the solution containing the ultra-thin fin LED element suitable for the printer device and method may be implemented as an ink composition so that the solution is used in the printer device or the like. In this case, the type of solvent may be appropriately selected in consideration of physical properties such as viscosity of the solvent, and the solution may further include additives added to a composition generally used in the corresponding device in consideration of the printing method and device. Further, the present invention is not particularly limited thereto.

Meanwhile, it has been described in operation (2) that the ultra-thin fin LED element is input in a solution state in which the ultra-thin fin LED element and the solvent are mixed with each other. It should be noted that operation (2) includes a case in which the solution is input as a result, which is the same as a case in which the ultra-thin fin LED element is first input onto the lower electrode line 200 and the solvent is then input thereonto or conversely the solvent is first input thereonto and the ultra-thin fin LED element is then input thereonto.

Further, the ultra-thin fin LED elements 101A, 101B, 101C, and 101D input onto the lower electrodes 211, 212, and 213 are self-aligned so that both ends of the ultra-thin fin LED elements 101A, 101B, 101C, and 101D in the long axis direction are in contact with the upper surfaces of two adjacent lower electrodes 211, 212, and 213 through the dielectrophoretic force by the electric field formed by the assembly power applied to the lower electrode line 200.

In this case, the application of the assembly power may be performed before, while, or after the solution including the ultra-thin fin LED elements 101A, 101B, 101C, and 101D is input, but the present invention is not particularly limited thereto.

Further, the applied assembly power may preferably have a frequency in a range of 1 kHz to 100 MHz and a voltage in a range of 5 Vpp to 100 Vpp. Further, more preferably, the assembly power may have a frequency in a range of 1 kHz to 200 kHz and a voltage in a range of 10 Vpp to 80 Vpp. When a voltage of lower than 5 Vpp is applied and/or a frequency of lower than 1 kHz is applied from the assembly power, it is difficult to achieve the alignment at a desired level, and the intensive arrangement may also be difficult. Further, when the voltage is higher than 100 Vpp, there is a risk that the lower electrodes 211, 212, and 213 or the electrode layer may be provided in the ultra-thin fin LED element may be damaged. Further, even when the frequency of the power source is higher than 100 MHZ, it is difficult to achieve the alignment at a desired level and the intensive arrangement of the element may be difficult.

Next, in operation (3) according to the present invention, an operation of forming the upper electrode line on the plurality of self-aligned ultra-thin fin LED elements 101A, 101B, 101C, and 101D is performed.

The number, the arrangement, the shape, or the like of the upper electrode line is not limited when it is designed that the upper electrode 301 included therein is in electrical contact with upper portions of the ultra-thin fin LED elements 101A, 101B, 101C, and 101D mounted on the lower electrode line 200. However, as illustrated in FIG. 1, when the lower electrode lines 200 are arranged side by side in one direction, the upper electrodes 301 and 302 constituting the upper electrode line 300 may be arranged side by side in a direction perpendicular to the one direction. This electrode arrangement corresponds to electrode arrangement that is widely used in displays and the like in the related art, and for this electrode arrangement, electrode arrangement and driving control technologies in the display field according to the related art may be used without change.

Meanwhile, it should be noted that FIG. 2 illustrates only the one upper electrode 301, but this is omitted for case of description, and there is an additional upper electrode that is disposed on the ultra-thin fin LED elements and is not illustrated.

Further, the upper electrode 301 may have a material, a shape, a width, and a thickness of an electrode used in a general LED electrode assembly and may be manufactured using a widely-known method, and thus the present invention does not specifically limit these. As an example, the upper electrode 301 may be made of aluminum, chrome, gold, silver, copper, graphene, ITO, or an alloy thereof and have a width in a range of 2 μm to 50 μm and a thickness in a range of 0.1 μm to 100 μm, but these factors may be appropriately changed in consideration of the size of the targeted LED electrode assembly.

Further, the upper electrode line may be implemented by patterning the electrode line using the widely-known photolithography and then depositing the electrode material or depositing the electrode material and then performing dry etching and/or wet etching. A detailed description of the forming method will be omitted.

Meanwhile, an operation of forming a conductive metal layer (not illustrated) that connects the lower electrodes 211, 212, and 213 and the ultra-thin fin LED elements 101A, 101B, 101C, and 101D to improve electrical contact between the lower electrodes 211, 212, and 213 and the ultra-thin fin LED elements 101A, 101B, 101C, and 101D in contact with the lower electrodes 211, 212, and 213 and an operation of forming a passive state layer 600 on the lower electrode line 200 while not covering the upper surfaces of the self-aligned ultra-thin fin LED elements 101A, 101B, 101C, and 101D may be further included between operations (2) and (3).

The conductive metal layer (not illustrated) may be manufactured by applying a photolithography process using a photosensitive material to pattern a line in which the conductive metal layer is to be deposited and then deposit the conductive metal layer or to pattern the deposited metal layer and then etch the patterned metal layer. This process may be performed by appropriately employing a widely-known method, and Korean Patent Application Publication No. 10-2020-0062462 by the inventor of the present invention may be inserted as a reference.

An operation of forming the passive state layer 600 on the lower electrode line 200 so as not to cover the upper surfaces of the self-aligned ultra-thin fin LED elements 101A, 101B, 101C, and 101D after the conductive metal layer is formed may be performed. The passive state layer 600 prevents electrical contact between the upper electrode line and the lower electrode line 200 that are opposite to each other in a vertical direction and functions to more easily implement the upper electrode line. The passive state layer 600 may be used without limitation as long as a material thereof is a passive state material that is generally used in electrical and electronic components. As an example, the passive state layer 600 may deposit a passive state material such as $SiO_2$ and $SiN_x$ through a plasma enhanced chemical vapor deposition (PECVD) method, deposit a passive state material such as AlN and GaN through a metalorganic chemical vapor deposition (MOCVD) method, or deposit a passive state material such as $Al_2P$, $HfO_2$, and $ZrO_2$ through an atomic layer deposition (ALD) method. Meanwhile, the passive state layer 600 may be formed so as not to cover the upper surfaces of the self-aligned ultra-thin fin LED elements 101A, 101B, 101C, and 101D. To this end, a passive state layer may be formed through deposition at a thickness at which the upper surfaces are not covered or the dry etching may be performed until the upper surfaces of the elements are exposed after the passive state layer is deposited to cover the upper surfaces.

The ultra-thin fin LED electrode assembly 1000 implemented through the above-described manufacturing method may include the plurality of lower electrodes 211, 212, and 213 that extend in the first direction $\alpha$2 and are spaced apart from each other in the second direction $\alpha$1, the alignment guide 550 that is disposed on the upper surfaces of the plurality of lower electrodes 211, 212, and 213 and extends in the first direction $\alpha$2 with a width smaller than that of each of the lower electrodes 211, 212, and 213, the plurality of ultra-thin fin LED elements 101A, 101B, 101C, and 101D in which the x axis direction is a long axis with respect to the x axis, the y axis, and the z axis perpendicular to each other, and the plurality of layers 10, 20, 30, 40, and 60 to be included therein are arranged such that both ends of the elements laminated in the z axis direction in the long axis direction are in contact with the upper surfaces of the two adjacent lower electrodes 211, 212, and 213, and the upper electrode line including the upper electrode 301 disposed on the ultra-thin fin LED elements 101A, 101B, 101C, and 101D, wherein a vertical mounting percentage that is a ratio of the ultra-thin fin LED elements in which a mounting angle $\theta$ formed between the long axis direction (of the ultra-thin fin LED elements and the second direction of the lower electrodes 211, 212, and 213 satisfies 5° or less to all the arranged ultra-thin fin LED elements may be 75% or more, preferably, 82% or more, and more preferably, 88% or more.

As described in the manufacturing method, the ultra-thin fin LED elements 101A, 101B, 101C, and 101D input into the process are self-aligned through adjustment of dielectric properties between the solvent used and the formed alignment guide, and then the vertical mounting percentage is greatly improved such that the mounting angle $\theta$ is 10° or less, especially the mounting angle $\theta$ is 5° or less. Therefore, the alignment can be improved, and the ultra-thin fin LED elements can be intensively arranged.

Further, a unit area of the ultra-thin fin LED electrode assembly 1000, which may be driven independently, may be, for example, 1 $\mu m^2$ to 100 $cm^2$, more preferably, 10 $\mu m^2$ to 100 $mm^2$, but the present invention is not limited thereto. Further, the ultra-thin fin LED electrode assembly 1000 may include 2 to 100,000 ultra-thin fin LED elements per unit area of 100×100 $\mu m^2$, but the present invention is not limited thereto.

Figure 11:
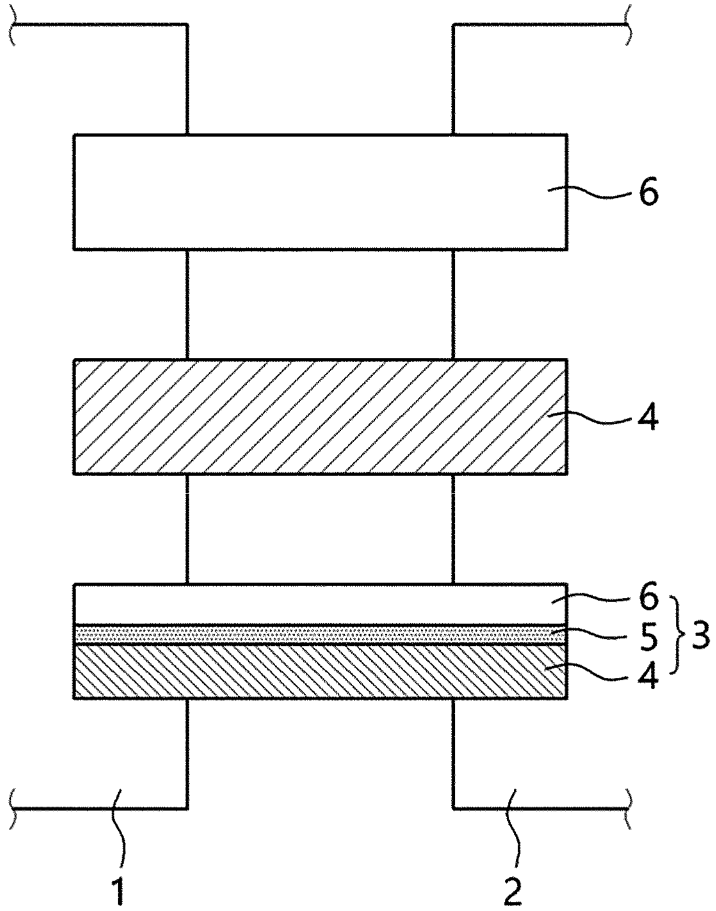
FIG. 11 is a schematic view of various mounting appearances that appear after the ultra-thin fin LED element is mounted on the lower electrode through operation (2) included in the embodiment of the present invention.

Meanwhile, as described above, the ultra-thin fin LED elements 101A, 101B, 101C, and 101D provided in the ultra-thin fin LED electrode assembly 1000 may not always be mounted to be drivable even when any one surface of the ultra-thin fin LED elements 101A, 101B, 101C, and 101D is in contact with the upper surfaces of the lower electrodes 211, 212, and 213. Referring to FIG. 11, ultra-thin fin LED elements 3 are self-aligned through dielectrophoresis such that ends of the ultra-thin fin LED element 3 in the long axis direction are in contact with two adjacent lower electrodes 1 and 2. Since a laminating direction of layers 4, 5, and 6 constituting the ultra-thin fin LED element 3 and the long axis direction of the ultra-thin fin LED element 3 are perpendicular to each other, a mounting form of the ultra-thin fin LED elements 3 mounted on the two lower electrodes 1 and 2 is classified into a case in which the first conductive semiconductor layer 4 or the second conductive semiconductor layer 6 facing each other in the thickness direction of the ultra-thin fin LED element 3 is in contact with surfaces of the two lower electrodes 1 and 2 or a case in which the first conductive semiconductor layer 4 or the second conductive semiconductor layer 6 is in contact with a side surface of the ultra-thin LED element 3. Among these mounting forms, when the ultra-thin fin LED elements 3 are mounted such that the side surfaces of the ultra-thin fin LED element 3 are in contact with the two lower electrodes 1 and 2, all of the first conductive semiconductor layer 4, the photoactive layer 5, and the second conductive semiconductor layer 6 are in contact with the lower electrodes 1 and 2. Thus, when driving power is applied to the upper electrode (not illustrated) and the lower electrodes 1 and 2, the ultra-thin fin LED elements 3 do not emit (drive) light, and even an electrical short circuit is caused.

Meanwhile, a case in which the electrical short circuit is caused as described above corresponds to a case in which a width that is a length of the ultra-thin fin LED element in the y axis direction is the same as or greater than a thickness that is a length of the ultra-thin fin LED element in the z axis direction. In description of the same case in detail, when the ultra-thin fin LED electrode assembly 1000 is viewed from a side surface, in the case of the ultra-thin fin LED element of which a side surface is mounted on the upper surface of the lower electrode, a height from the upper surface of the lower electrode to an opposite surface to a mounting surface of the mounted ultra-thin fin LED element may be the same as that of the ultra-thin fin LED element mounted to be driven. In this case, the ultra-thin fin LED element mounted such that a side surface S thereof is in contact with the upper surface of the lower electrode is also electrically connected to the upper electrode, and accordingly, an electrical leakage or electrical short circuit may be caused.

Figure 12:
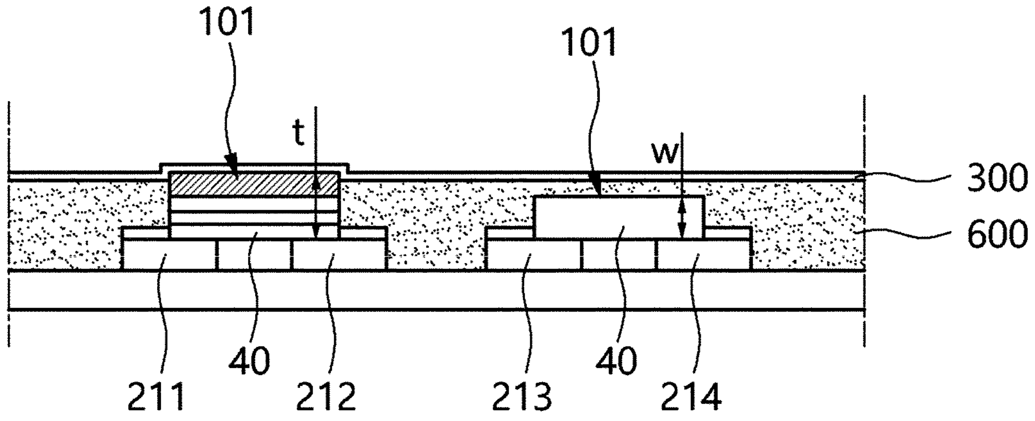
FIG. 12 is a schematic cross-sectional view of the ultra-thin fin LED electrode assembly according to the embodiment of the present invention.

Accordingly, according to the embodiment of the present invention, a width of the ultra-thin fin LED element 101 may be smaller than a thickness thereof. Therefore, it is possible to prevent electrical short circuit or leakage that sometimes occurs when the side surface S of the ultra-thin fin LED element 101 is in contact with the lower electrode. Referring to FIG. 12, even when the side surface S is in contact with and mounted on the lower electrodes 213 and 214 positioned on the right side among the four lower electrodes 211, 212, 213, and 214, which is like the contacting ultra-thin fin LED element 101, since a width W is smaller than a thickness t of the ultra-thin fin LED element 101, the ultra-thin fin LED element having the contacting side surface S has no risk of contact with the upper electrode line, and accordingly, it is possible to prevent electrical short circuits and leakages that may occur due to the ultra-thin fin LED element 101 on the right side when the driving power is applied.

The ultra-thin fin LED electrode assembly 1000 according to the embodiment of the present invention may be applied to a widely-known light source employing an LED element. For example, the light source may be a point, line, or surface light source. Further, the light source may be a widely known device or instrument, having the form of points, lines, or surfaces, such as lights, optical devices, various displays, beauty devices, or medical devices. For example, the various displays may be light-receiving displays in which the ultra-thin fin LED electrode assembly is provided in a backlight unit and emits light to a display unit containing liquid crystals to implement a desired image. Alternatively, the display may be an active display and may be, for example, a display in which a blue ultra-thin fin LED electrode assembly that emits blue light, a green ultra-thin fin LED electrode assembly that emits green light, and a red ultra-thin fin LED electrode assembly that emits red light are provided to implement a full-color image. In this case, the ultra-thin fin LED electrode assembly corresponding to an one specific color may be implemented such that the provided ultra-thin fin LED element directly emits light having the one specific color or implemented such that light emitted from the ultra-thin fin LED element is excited through a color conversion material, which will be described below and is emitted as light having the one specific color.

Further, the medical device may be, for example, an optogenetic LED light source that emits light having a predetermined wavelength to a brain to activate a neural network in a corresponding area. The optogenetic LED light source may include a plurality of ultra-thin fin LED electrodes assembly on a support. Further, the beauty device may be, for example, a skin care LED mask and may be implemented such that the plurality of ultra-thin fin LED electrode assemblies are provided on an inner surface of a mask support that is in contact with a skin.

Further, the ultra-thin fin LED elements provided in the light source may include one type of ultra-thin fin LED elements to substantially express one type of light color or two or more types of ultra-thin fin LED elements may be provided in one light source to express two or more types of light colors. In this case, the light color may be, for example, one of UV, blue, green, yellow, amber, and red.

Further, the light source may further include the color conversion material so that the light emitted from the ultra-thin fin LED electrode assembly 1000 is recognized by a user as light having a specific wavelength. The color conversion material is excited by light emitted from the ultra-thin fin LED elements 101A, 101B, 101C, and 101D and functions to emit light having a specific wavelength. As an example, a specific type of color conversion material may be determined in consideration of a light color emitted from the selected ultra-thin fin LED element. As an example, in the case of a device that emits UV, the color conversion material may be one or more of blue, cyan, yellow, green, amber, and red, and therefore, a single color light source having any one color or a white light source may be implemented. As an example of implementing the white light source, in the case of a UV-emitting element, the color conversion material may be mixture of any one of blue/yellow, red/cyan, blue/green/red, and blue/green/amber/red, and therefore can implement the white light source. Further, in the case of an element that emits a blue light, the color conversion material may be one or more of yellow, cyan, green, amber, and red, and therefore can implement the single color light source or the white color light source. As an example of implementing the white light source, two or more colors may be combined, and in detail, the white light source may be implemented by combining any one mixture of blue/yellow, red/cyan, blue/green/red, and blue/green/amber/red.

Meanwhile, the color conversion material may be a widely-known phosphor or quantum dot used in lighting, display, or the like, and the present invention does not specifically limit a specific type thereof.

EXAMPLES

The present invention will be described in more detail through the following examples, but the following examples do not limit the scope of the present invention, and it should be interpreted that the following example helps understanding of the present invention.

Example 1

First, the ultra-thin fin LED elements were prepared as follows. In detail, an LED wafer in which an undoped n-type III-nitride semiconductor layer, an n-type III-nitride semiconductor layer (having a thickness of 4 μm) doped with Si, a photoactive layer (having a thickness of 0.15 μm), and a p-type III-nitride semiconductor layer (having a thickness of 0.05 μm) are sequentially laminated on a substrate was prepared. After ITO (having a thickness of 0.15 μm) as an electrode layer, $SiO_2$ (having a thickness of 1.2 μm) as a first mask layer, and a Ni (having a thickness of 80.6 nm) as a second mask layer were sequentially deposited on the prepared LED wafer, an SOG resin layer, to which a rectangular pattern was transferred, was transferred onto the second mask layer using a nanoimprint apparatus. Thereafter, the SOG resin layer was cured using reactive-ion etching (RIE), a residual resin portion of the resin layer was etched through RIE, and thus a resin pattern layer was formed. Thereafter, along the pattern, the second mask layer was etched using inductively coupled plasma (ICP), and the first mask layer was etched using RIE. Thereafter, using the ICP, a first electrode layer, the p-type III-nitride semiconductor layer, and the photoactive layer were etched and then the doped n-type III-nitride semiconductor layer was etched to a thickness of 0.5 μm. An LED wafer on which a plurality of LED structures (having a long side of 4 μm, a short side of 750 nm, and a height of 850 nm) from which mask pattern layers were removed through KOH wet etching were formed was manufactured. Thereafter, a temporary protective film made of $Al_2O_3$ was deposited on the LED wafer on which the plurality of LED structures were formed (LED structure-side surface reference deposition thickness of 72 nm). Thereafter, the temporary protective film formed between the plurality of LED structures was removed through RIE, and thus an upper surface of the doped n-type III-nitride semiconductor layer between the LED structures was exposed.

Figure 3:
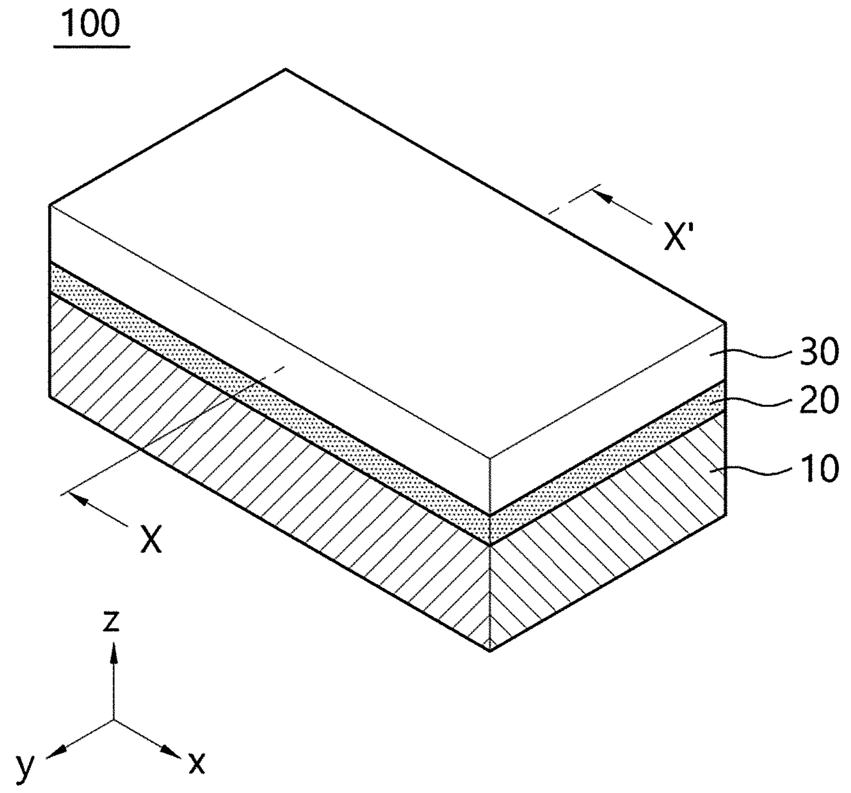
Figure 4:
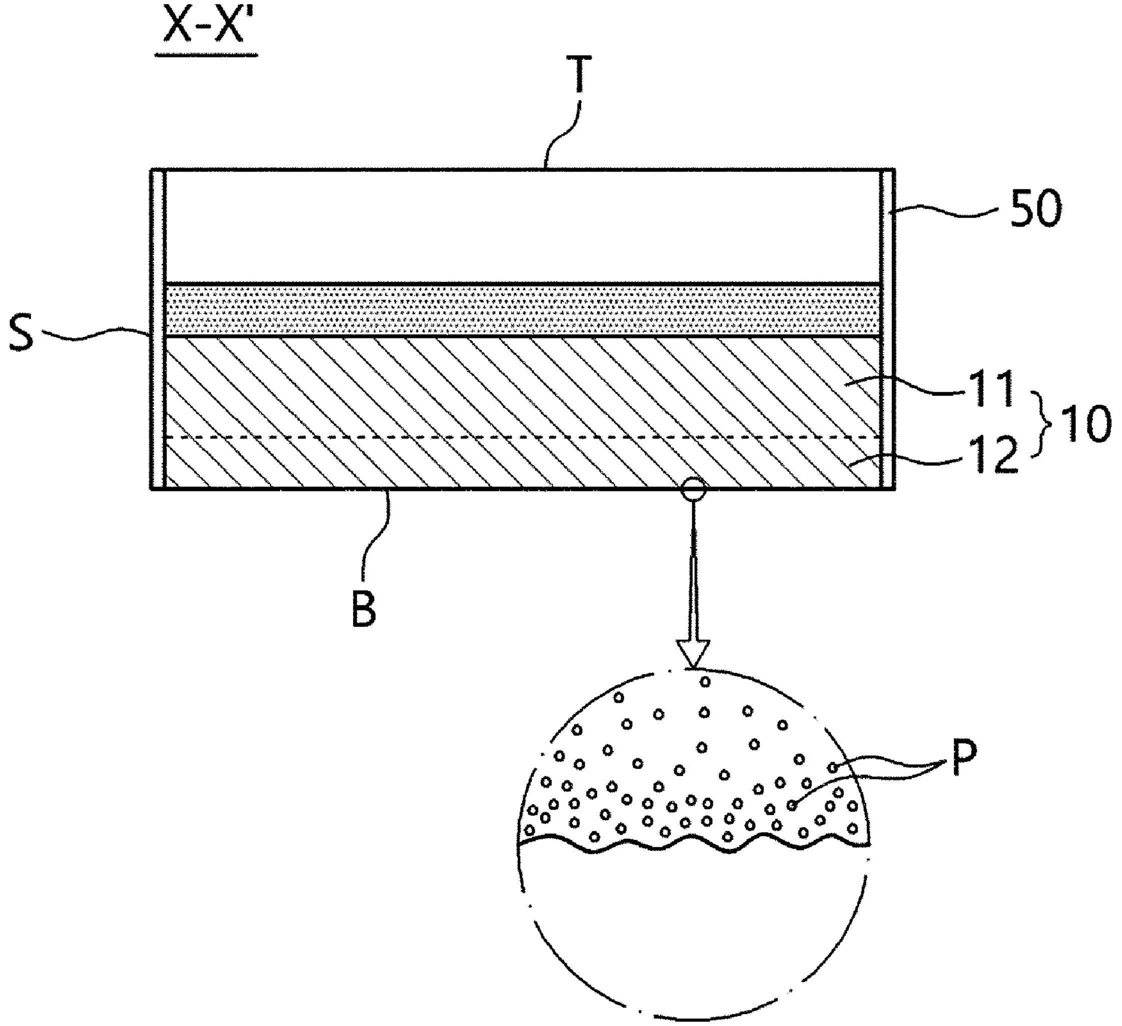
Figure 5:
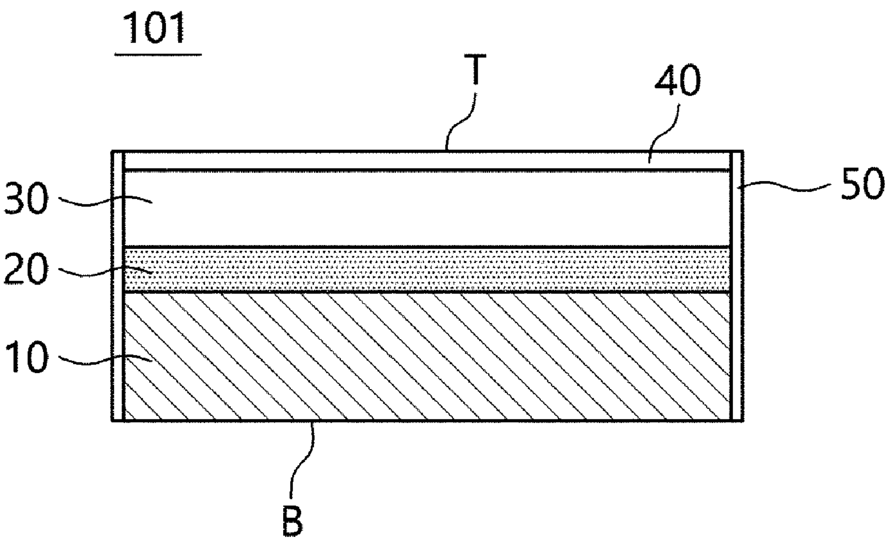
FIGS. 5 and 6 are cross-sectional views perpendicular to a longitudinal direction of the ultra-thin fin LED element included in various embodiments of the present invention.
Figure 6:
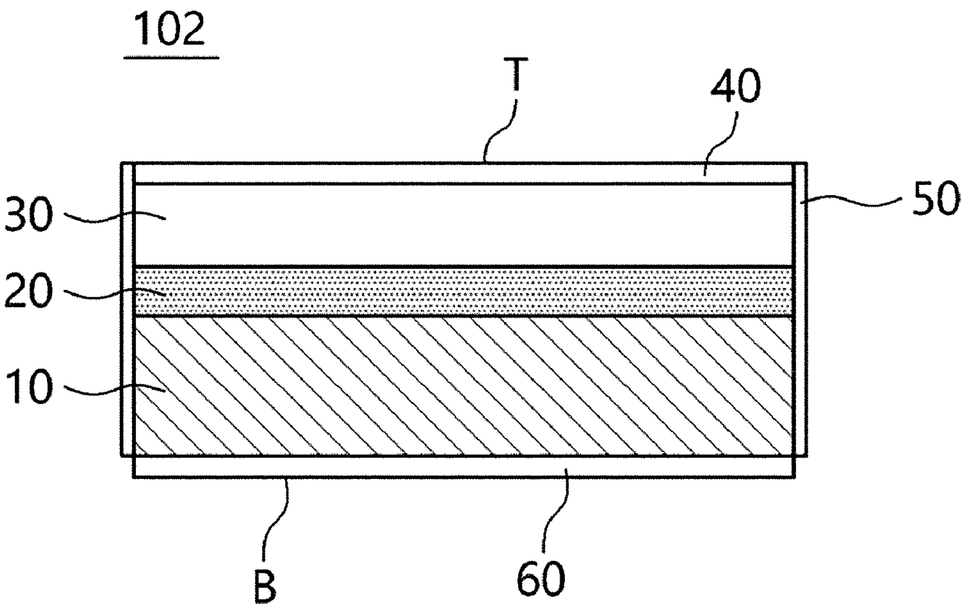
Figure 13:
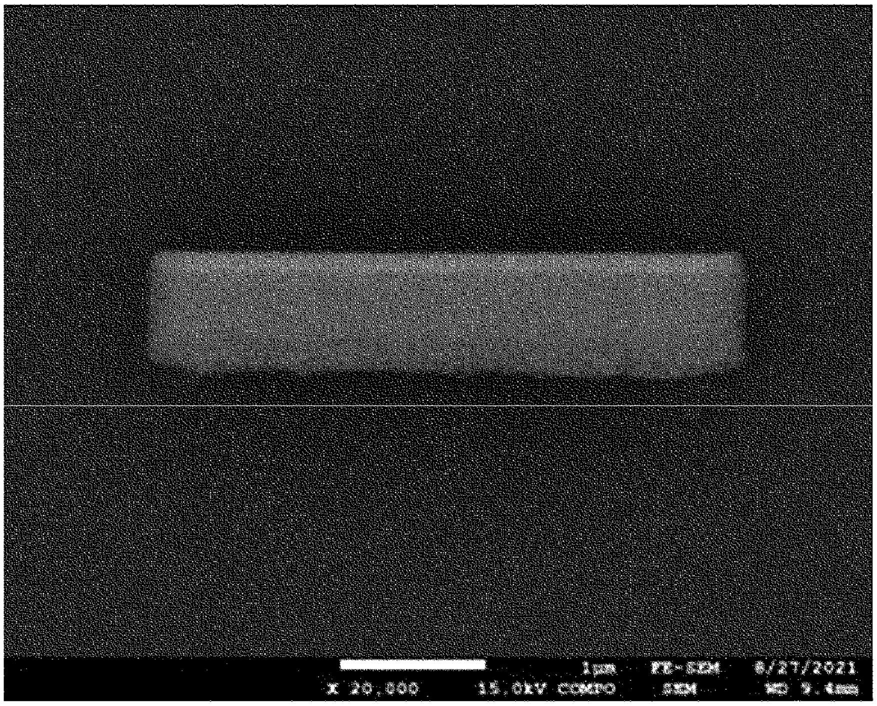
FIG. 13 is a side scanning electron microscope (SEM) picture of the ultra-thin fin LED device included in the embodiment of the present invention.

Thereafter, the LED wafer on which the temporary protective film was formed was impregnated with an electrolyte solution that was a 0.3 M oxalic acid solution and then connected to an anode terminal of a power supply. After a cathode terminal was connected to a platinum electrode impregnated with the electrolyte, a voltage of 15 V was applied for five minutes, and thus a number of pores were formed in a certain area in a thickness direction from the surface of the doped n-type II-nitride semiconductor layer between the LED structures. Thereafter, the temporary protective film was removed through ICP, and then a protective film made of $SiO_2$ was deposited to a thickness of 6 nm on a side surface of the LED structure. Thereafter, a protective film material formed between the LED structures was removed through RIE to expose the upper surface of the doped n-type III-nitride semiconductor layer between the LED structures. Thereafter, a plurality of ultra-thin fin LED elements as illustrated in a scanning electron microscope (SEM) image of FIGS. 3 and 13 were manufactured in which the LED wafer was immersed in a 100% gamma-butyrolactone bubble-forming solution and then irradiated with ultrasound at an intensity of 160 W and 40 kHz for 10 minutes to collapse pores formed in the doped n-type III-nitride semiconductor layer using generated bubbles, as illustrated in FIG. 3, the doped n-type III-nitride semiconductor layer 10 contained a plurality of pores P in a certain area 11 in the thickness direction from an element first surface B, and the doped n-type III-nitride semiconductor layer 10 that did not contain pores, the photoactive layer 20, the p-type III-nitride semiconductor layer 30, and the electrode layer 40 that is an ITO having an element second surface T were formed in the remaining area 12.

Thereafter, a lower electrode line in which the first lower electrode and the second lower electrode extending long in the first direction were alternately formed at intervals of 2 μm in the second direction perpendicular to the first direction was manufactured on a base substrate made of quartz and having a thickness of 500 μm. In this case, each of the first lower electrode and the second lower electrode had a width of 10 μm and a thickness of 0.2 μm, a material of the first lower electrode and the second lower electrode was gold, and an area of a region in which the ultra-thin fin LED element was mounted on the lower electrode line was set to 1 $mm^2$. Thereafter, the alignment guide having a width of 4 μm, a height of 0.8 μm, and a dielectric constant of 3.9 and made of $SiO_2$ was patterned at a lower electrode central portion including the first lower electrode and the second lower electrode using a photosensitive material by the photolithography and was then formed by a plasma chemical vapor deposition method.

Further, an insulating partition wall having a height of 0.5 μm and made of $SiO_2$ was formed on the base substrate to surround the mounted area.

Thereafter, a solution was prepared by mixing 120 ultra-thin fin LED elements in acetone having a dielectric constant of 20.7, 9 μl of the prepared solution was dropped into the mounted area twice, a sine wave alternating current (AC) power having 10 kHz and 40 Vpp as the assembly power was applied to the first lower electrode and the second lower electrode, and then the ultra-thin fin LED element was mounted on the lower electrode through dielectrophoresis.

Thereafter, a passive state material made of $SiO_2$ was deposited using the PECVD method to a height corresponding to the thickness of the ultra-thin fin LED element in the area in which the ultra-thin fin LED element was mounted, a plurality of upper electrodes (having a width of 10 μm, a thickness of 0.2 μm, an interval between the electrodes of 3 μm, and a material of gold) extending in the second direction perpendicular to the first direction and spaced apart from each other in the first direction were formed on an upper surface of the mounted ultra-thin fin LED element, and thus the ultra-thin fin LED electrode assembly was implemented.

Examples 2 and 3

The ultra-thin fin LED electrode assembly was implemented and manufactured in the same manner as that in Example 1 and was implemented by changing a material of the alignment guide and/or a type of the solvent in Table 1.

In this case, the changed solvent was tert-butanol which had a dielectric constant of 10.9.

Comparative Example 1

The ultra-thin fin LED electrode assembly was implemented and manufactured in the same manner as that in Example 1 and was implemented by changing a material of the alignment guide and/or a type of the solvent in Table 1.

Comparative Example 2

The ultra-thin fin LED electrode assembly was implemented and manufactured in the same manner as in Example 1 without an alignment guide.

Experimental Example 1

For the ultra-thin fin LED electrode assembly according to Examples 1 to 3 and Comparative Examples 1 to 2, the mounting angle of the ultra-thin fin LED element was evaluated as follows, and results thereof are illustrated in Table 1 below.

In detail, a vertical mounting percentage that is a ratio of the ultra-thin fin LED elements having an mounting angle of 5° or less to all the mounted ultra-thin fin LED elements was expressed in Table 1 below in which the mounting angle of each of the ultra-thin fin LED elements in contact with the upper surface of the lower electrode on the area was measured by capturing an SEM image in a state in which the ultra-thin fin LED element was self-aligned after an assembly voltage was applied during a process of manufacturing the ultra-thin fin LED electrode assembly. Further, SEM images according to Example 1 and Comparative Example 1 are illustrated in FIGS. 14 and 15.

TABLE 1

| | Dielectric constant($\varepsilon_1$) of solvent | Dielectric constant($\varepsilon_2$) (material) of alignment guide | Difference between dielectric constants of solvent and alignment guide | Vertical mounting percentage (%) |
|---|---|---|---|---|
| Example 1 | 20.7 | 3.9 ($SiO_2$) | 16.8 | 91.8 |
| Example 2 | 20.7 | 9.0 ($Al_2O_3$) | 10.2 | 88.2 |
| Example 3 | 10.9 | 9.0 ($Al_2O_3$) | 1.1 | 75.5 |
| Comparative Example 1 | 20.7 | 80 ($TiO_2$) | −59.3 | 41.5 |
| Comparative Example 2 | 20.7 | No installation | — | 59.0 |

Figure 14:
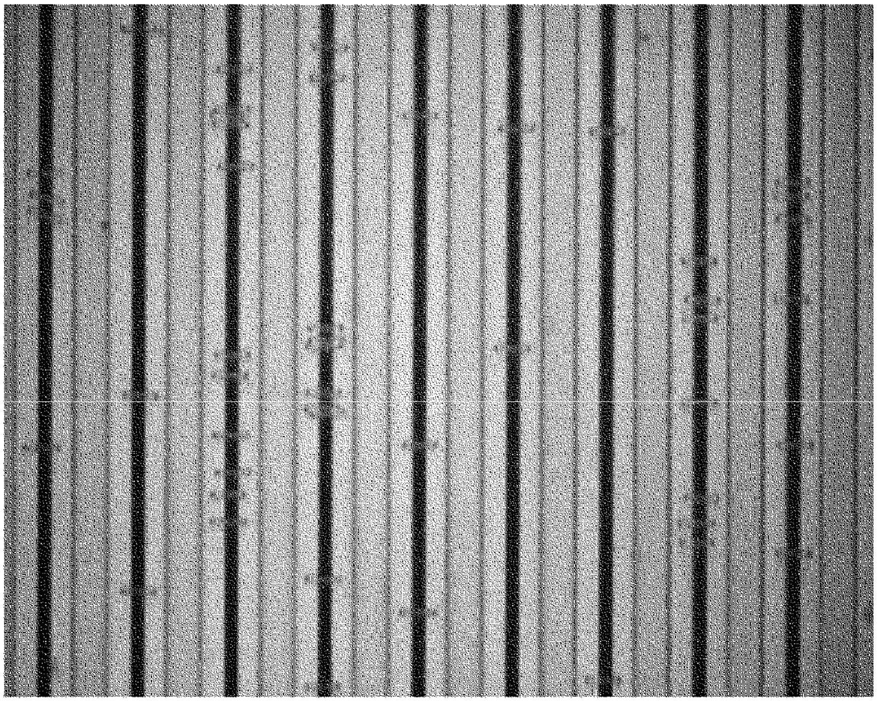
FIG. 14 is an SEM picture of a partial area of the ultra-thin fin LED electrode assembly according to a first example, which is a picture according to an experimental result of a first experimental example, the ultra-thin fin LED element being mounted on the partial area.
Figure 15:
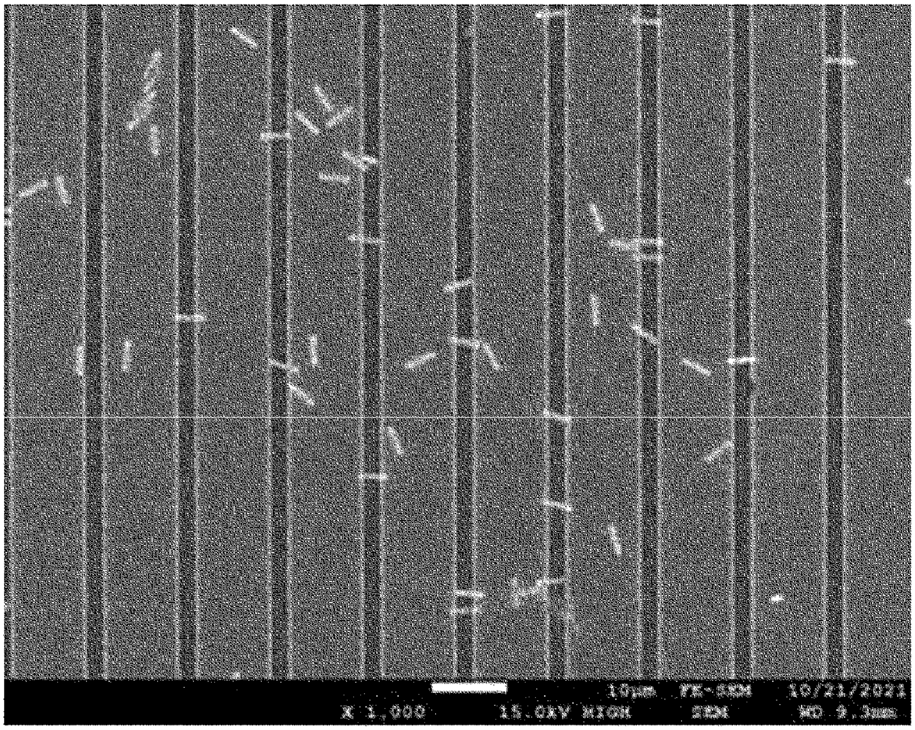
FIG. 15 is an SEM picture of a partial area of the ultra-thin fin LED electrode assembly according to a first comparative example, which is a picture according to the experimental result of the first experimental example, the ultra-thin fin LED element being mounted on the partial area.

As can be identified through Table 1 and FIGS. 14 and 15:

It can be identified that in Comparative Example 2 in which there was no alignment guide, the vertical mounting percentage was merely 59.0%, but in Examples 1 to 3 in which the alignment guide was formed, the vertical mounting percentage significantly increased to 75.5% or more.

However, it can be identified that, even when the alignment guide was formed, in Comparative Example 1 in which the alignment guide having a dielectric constant higher than that of the solvent was formed, the vertical mounting percentage was greatly reduced as compared to the Examples.

In an ultra-thin fin LED electrode assembly according to the present invention, the number of LED elements mounted per unit area can greatly increase by controlling a longitudinal direction of each LED element self-aligned on a lower electrode through dielectrophoresis. Therefore, a high-brightness LED electrode assembly can be implemented. Further, since it is easy to control an alignment direction of each of the mounted LED element so that the alignment direction has substantially one direction, an upper electrode line can be easily formed and can be designed in various and detailed manners. Thus, since the LED elements can be driven in detail in various areas within one LED electrode assembly, the present invention can be widely applied to light sources of various lights, displays, medical devices, and various optical devices.

Although embodiments of the present invention have been described above, the spirit of the present invention is not limited to the embodiments presented in the present specification. Those skilled in the art who understand the spirit of the present invention could easily propose other embodiments by adding, changing, deleting, adding, or the like of components within the same scope of the spirit. Further, these other embodiments also belong to the scope of the spirit of the present invention.

What is claimed is:

1. A method of manufacturing an ultra-thin fin light emitting diode (LED) electrode assembly, the method comprising:

operation (1) of forming an alignment guide extending in a first direction with a width smaller than a width of a lower electrode on an upper surface of each of a plurality of lower electrodes extending in the first direction and spaced apart from each other in a second direction, each of the alignment guides being disposed on a respective single one of the lower electrodes such that the alignment guides are spaced apart from one another in the second direction;

operation (2) of self-aligning a plurality of ultra-thin fin LED elements such that both ends of the ultra-thin fin LED elements in a long axis direction are in contact with upper surfaces of two adjacent lower electrodes by inputting, onto the lower electrodes, a solution including the ultra-thin fin LED elements of which an X axis is a long axis with respect to an x axis, a y axis and a z axis perpendicular to each other and in which a plurality of layers to be included therein are laminated in a z axis direction and by applying assembly power to the lower electrodes; and operation (3) of forming an upper electrode line on the plurality of self-aligned ultra-thin fin LED elements, wherein a dielectric constant ($\varepsilon_1$) of a solvent included in the solution is greater than a dielectric constant ($\varepsilon_2$) of the alignment guide.

2. The method of claim 1, wherein the width of the alignment guide is smaller than or equal to a half of the width of the lower electrode, and a thickness of the alignment guide is smaller than or equal to a thickness that is a length of the ultra-thin fin LED element in a z axis direction.

3. The method of claim 1, wherein the ultra-thin fin LED element has an aspect ratio (a/b) of 3.0 or more between a length (b) of a short axis corresponding to a larger length among lengths in a y axis direction or the z axis direction and a length (a) of a long axis corresponding to an x axis.

4. The method of claim 1, wherein the solvent has a dielectric constant that is smaller than or equal to 30.

5. The method of claim 1, wherein the assembly power applied in operation (2) has a frequency in a range of 1 kHz to 100 MHz and a voltage in a range of 5 Vpp to 100 Vpp.

6. The method of claim 1, wherein the dielectric constant ($\varepsilon_1$) of the solvent is greater than the dielectric constant ($\varepsilon_2$) of the alignment guide by 5.0 or more.

7. An ultra-thin fin light emitting diode (LED) electrode assembly comprising:

a plurality of lower electrodes extending long in a first direction and spaced apart from each other in a second direction;

an alignment guide disposed on an upper surface of each of the plurality of lower electrodes and extending in the first direction with a width smaller than that of each of the lower electrodes, each of the alignment guides being disposed on a respective single one of the lower electrodes such that the alignment guides are spaced apart from one another in the second direction;

a plurality of ultra-thin fin LED elements arranged such that both ends of the ultra-thin fin LED elements, of which an X axis is a long axis with respect to an x axis, a y axis and a z axis perpendicular to each other and in which a plurality of layers to be included therein are laminated in a z axis direction, in a long axis direction are in contact with upper surfaces of two adjacent lower electrodes; and an upper electrode line disposed on the plurality of ultra-thin fin LED elements, wherein, among all the arranged ultra-thin fin LED elements, a vertical mounting percentage that is a ratio of the ultra-thin fin LED elements of which a mounting angle formed between the long axis direction of the ultra-thin fin LED element and a second direction perpendicular to the first direction of the lower electrode satisfies 5° or less is 75% or more.

8. The ultra-thin fin LED electrode assembly of claim 7, wherein the vertical mounting percentage is 82% or more.

9. The ultra-thin fin LED electrode assembly of claim 7, wherein the plurality of layers included in the ultra-thin fin LED element include a n-type conductive semiconductor layer, a photoactive layer, and a p-type conductive semiconductor layer.

10. The ultra-thin fin LED electrode assembly of claim 7, wherein a length of the ultra-thin fin LED element in the long axis direction is in a range of 1 μm to 10 μm, and a thickness thereof is in a range of 0.1 μm to 3 μm.

11. The ultra-thin fin LED electrode assembly of claim 7, wherein a width of the ultra-thin fin LED element, which is a length in a y axis direction, is smaller than a thickness thereof.

12. A light source comprising the ultra-thin fin LED electrode assembly according to claim 7.

13. The light source of claim 12, further comprising a color conversion material excited by light radiated from the ultra-thin fin LED electrode assembly.

* * * * *